(12) United States Patent
West et al.

(10) Patent No.: US 9,062,897 B2
(45) Date of Patent: *Jun. 23, 2015

(54) SOLAR PANEL ATTACHMENT SYSTEM

(71) Applicant: Zep Solar LLC, San Rafael, CA (US)

(72) Inventors: Jack Raymond West, San Rafael, CA (US); Tyrus Hudson, San Rafael, CA (US); David Molina, San Rafael, CA (US); Ian Capsuto, San Rafael, CA (US)

(73) Assignee: Zep Solar, LLC, San Rafael, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/548,572

(22) Filed: Nov. 20, 2014

(65) Prior Publication Data

US 2015/0069198 A1 Mar. 12, 2015

Related U.S. Application Data

(63) Continuation of application No. 14/252,985, filed on Apr. 15, 2014, which is a continuation of application No. 13/673,985, filed on Nov. 9, 2012, now Pat. No. 8,756,881.

(60) Provisional application No. 61/557,821, filed on Nov. 9, 2011, provisional application No. 61/656,230, filed on Jun. 6, 2012.

(51) Int. Cl.
*E04D 13/18* (2014.01)
*E04H 14/00* (2006.01)
(Continued)

(52) U.S. Cl.
CPC .................. *F24J 2/5228* (2013.01); *E04B 1/38* (2013.01); *E04B 1/68* (2013.01); *Y02B 10/12* (2013.01);
(Continued)

(58) Field of Classification Search
CPC ........ Y02B 10/12; F24J 2/5245; F24J 2/5252; F24J 2002/5294; F24J 2/5258; F24J 2/5254
USPC .......... 52/27, 24, 58, 60, 62, 219, 173.3, 698; 248/148, 237, 48.1, 200, 205.1; 136/244; 126/623
See application file for complete search history.

(56) References Cited

U.S. PATENT DOCUMENTS 3,141,532 A 7/1964 Runyan
3,633,862 A 1/1972 Breen
(Continued)

OTHER PUBLICATIONS

EcoFasten Solar, QuikFoot Product Guide, pp. 1-22, Jul. 2012.
(Continued)

*Primary Examiner* — Chi Q Nguyen
(74) *Attorney, Agent, or Firm* — Larry D. Johnson

(57) ABSTRACT

A method, system and apparatus are disclosed regarding an attachment system for solar equipment, sometimes referred to as a flashing device allowing quick and easy assembling of the solar equipment into an array or other combination in a sturdy and durable manner. In examples of the present technology, a flashing device may include a flashing plate which may contain one or more raised features to further direct and control the flow of liquid over the flashing plate. The flashing device may also contain a fluid restrictor such as a seal or part of a seal usually held within an aperture of a block having a skyward facing essentially or substantially flat surface. One or more various items of solar equipment may be attached to the essentially flat surface of the block. Also disclosed are adjustable mounting feet which may be installed in connection with other solar equipment.

14 Claims, 36 Drawing Sheets

(51) Int. Cl.
*F24J 2/52* (2006.01)
*E04B 1/38* (2006.01)
*E04B 1/68* (2006.01)
*H02S 20/23* (2014.01)

(52) U.S. Cl.
CPC ............... *Y02B 10/20* (2013.01); *F24J 2/5245* (2013.01); *F24J 2/5258* (2013.01); *F24J 2002/5296* (2013.01); *H02S 20/23* (2014.12); *F24J 2/5205* (2013.01); *F24J 2002/5226* (2013.01); *F24J 2002/5294* (2013.01); *Y02E 10/47* (2013.01); *F24J 2/5249* (2013.01); *F24J 2/5252* (2013.01); *F24J 2/5254* (2013.01); *F24J 2/5266* (2013.01)

(56) References Cited

U.S. PATENT DOCUMENTS

| | | | |
|---|---|---|---|
| 4,226,058 A | 10/1980 | Riley | |
| 4,269,012 A | 5/1981 | Mattingly et al. | |
| 4,321,745 A | 3/1982 | Ford | |
| 4,554,773 A | 11/1985 | Conley | |
| 4,892,429 A | 1/1990 | Giannuzzi | |
| 5,082,412 A | 1/1992 | Thomas | |
| 5,528,872 A | 6/1996 | Rotter | |
| 5,797,232 A | 8/1998 | Larson | |
| 5,873,201 A | 2/1999 | Fey | |
| 5,882,043 A | 3/1999 | Murphy et al. | |
| 6,354,046 B1 | 3/2002 | Swearingen | |
| 6,360,491 B1 | 3/2002 | Ullman | |
| 6,414,237 B1 | 7/2002 | Boer | |
| 6,514,005 B2 | 2/2003 | Shiokawa et al. | |
| 6,526,701 B2 * | 3/2003 | Stearns et al. | 52/24 |
| 6,918,724 B2 | 7/2005 | Eriksson | |
| 7,592,537 B1 | 9/2009 | West | |
| 7,600,349 B2 | 10/2009 | Liebendorfer | |
| 7,762,027 B1 | 7/2010 | Wentworth et al. | |
| 7,828,372 B2 | 11/2010 | Ellison | |
| 7,857,269 B2 | 12/2010 | Plaisted et al. | |
| 7,935,202 B2 | 5/2011 | Stanley | |
| 8,109,048 B2 | 2/2012 | West et al. | |
| 8,122,648 B1 | 2/2012 | Liu | |
| 8,146,299 B2 * | 4/2012 | Stearns et al. | 52/58 |
| 8,151,222 B2 | 4/2012 | Kim | |
| 8,153,700 B2 | 4/2012 | Stearns et al. | |
| 8,166,713 B2 | 5/2012 | Stearns et al. | |
| 8,181,398 B2 | 5/2012 | Stearns et al. | |
| 8,209,914 B2 | 7/2012 | Stearns et al. | |
| 8,225,557 B2 | 7/2012 | Stearns et al. | |
| 8,245,454 B2 | 8/2012 | Stearns et al. | |
| 8,266,846 B2 | 9/2012 | Schoell | |
| 8,272,174 B2 | 9/2012 | Stearns et al. | |
| 8,375,654 B1 | 2/2013 | West et al. | |
| 8,448,405 B2 | 5/2013 | Schaefer et al. | |
| 8,479,455 B2 | 7/2013 | Schaefer et al. | |
| 8,539,719 B2 | 9/2013 | McPheeters et al. | |
| 8,756,881 B2 * | 6/2014 | West et al. | 52/173.3 |
| 2002/0046506 A1 | 4/2002 | Ullman | |
| 2003/0101662 A1 | 6/2003 | Ullman | |
| 2003/0177706 A1 | 9/2003 | Ullman | |
| 2008/0245404 A1 | 10/2008 | DeLiddo | |
| 2010/0192505 A1 | 8/2010 | Schaefer et al. | |

OTHER PUBLICATIONS

Oatey Technical Specification, Aurora No Chalk Solar Flashings, pp. 1-1, Feb. 2011.
Zilla Corporation, Zilla Double Stud Flashing, pp. 1-3, 2014.
Zilla Corporation, Zilla Electrical Flashing Assembly, pp. 1-3, 2014.
Zilla Corporation, Zilla PVC Electrical Flashing Assembly, pp. 1-3, 2014.
Zilla Corporation, Zilla Thermal Flashing Assembly, pp. 1-1, Jun. 2011.
Zilla Corporation, Zilla Zip Flashing Assembly, pp. 1-3, 2014.

\* cited by examiner

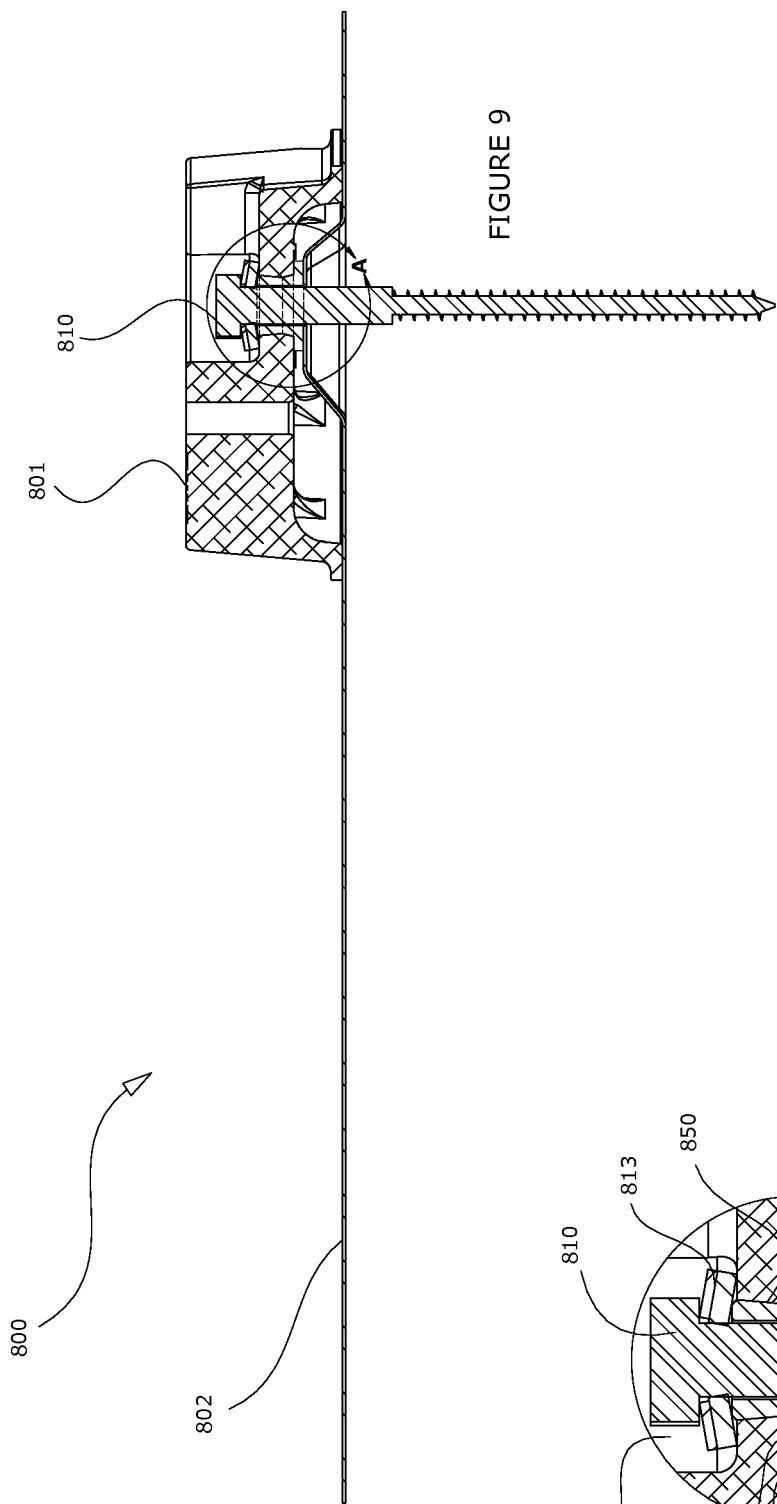
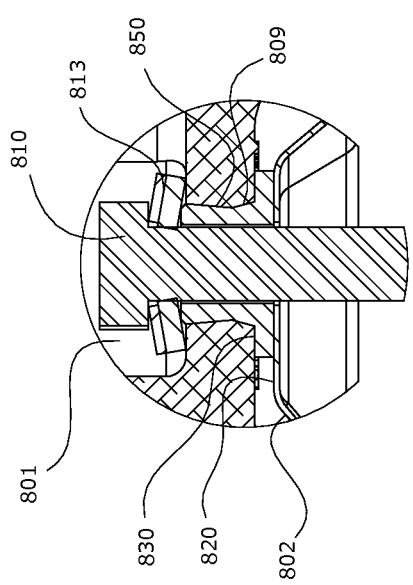

SOLAR PANEL ATTACHMENT SYSTEM

CROSS REFERENCES

This application is a continuation of U.S. Ser. No. 14/252,985, filed Apr. 15, 2014, which is a continuation of U.S. Ser. No. 13/673,985, filed Nov. 9, 2012, now U.S. Pat. No. 8,756,881, issued Jun. 24, 2014, which claims priority to U.S. Provisional Ser. No. 61/557,821, filed Nov. 9, 2011, and U.S. Provisional Ser. No. 61/656,230, filed Jun. 6, 2012. The foregoing applications are incorporated by reference in their entirety as if fully set forth herein.

BACKGROUND

Solar panels and related equipment are frequently mounted on support structures (such as roofs), or other objects that require a substantially water-tight or water resistant connection. For example, solar panels mounted on a roof of a building are commonly attached to the roof via an attachment system that includes one or more flashing devices that allow a roof-penetrating member, such as a lag screw, to penetrate a portion of a roofing membrane without compromising the roof's ability to prevent water from entering the building.

Prior art attempts to develop such flashing devices have suffered from a number a drawbacks. For example, some conventional flashing devices do not provide adequate pressure on the seal around the lag screw. Others do not allow for a separately positionable bracket that enables adjustability relative to the lag screw after installation thereof. Others do not work well with rail-free mounting systems such as those disclosed in prior art patents and other patents and applications of common assignee and at least one common inventor. Others do not comprise a support portion with multiple holes or slots for connecting brackets and/or other devices in various positions to allow for connection to different locations along a PV module frame. And still others are costly, do not optimize materials usage, create seals from brittle materials that have higher failure rates than resilient materials, require expensive manufacturing methods, and/or do not properly account for misalignment of components during installation.

The foregoing examples of the related art and limitations related therewith are intended to be illustrative and not exclusive. Other limitations of the related art will become apparent to those of skill in the art upon a reading of the specification and a study of the figures.

SUMMARY OF THE INVENTION

An attachment system, method and apparatus for solar equipment is disclosed. The following embodiments and aspects thereof are described and illustrated in conjunction with systems, apparatus, tools, and methods which are meant to be exemplary and illustrative, not limiting in scope. In various embodiments, one or more of the above-described problems have been reduced or eliminated, while other embodiments are directed to other advantages or improvements.

One embodiment provides an attachment system for solar equipment comprising a support portion with an associated fluid restrictor portion and a flashing plate with a raised, substantially flat surface and a fastener that extends through the above noted portions, such that rotation or advancement of the fastener varies an amount of compression on the fluid restrictor portion.

Another embodiment provides an attachment system for solar equipment comprising a support portion, a flashing plate, a variably positionable bracket, a fluid restrictor portion and a fastener which may be used to connect an assembly of the above noted portions to a support structure, such as a roof.

A further embodiment provides a flashing device for a solar panel having a support portion having a clearance hole and a threaded hole, a center point of the threaded hole located a first distance from a center point of the clearance hole and a second distance from a distal supporting portion of the support portion, with the second distance extending further than the first distance, with the first and second distances measured along an uppermost planar surface of the support portion; further with a distal supporting portion located along a second line extending in a direction between 90° and 180° away from a first line connecting the center points of the threaded hole and clearance hole.

In addition to the exemplary aspects and embodiments described above, further aspects and embodiments will become apparent by reference to the figures and by study of the following detailed descriptions.

BRIEF DESCRIPTION OF THE DRAWINGS

Demonstrative embodiments are illustrated in referenced figures and drawings. It is intended that the embodiments and figures disclosed herein are to be considered illustrative rather than restrictive.

FIG. 9 is a section side view of the attachment system for solar equipment shown in FIG. 8;

FIG. 9A is an enlargement of the portion of FIG. 8 within the oval marked at A;

DETAILED DESCRIPTION OF THE INVENTION

Figure 1:
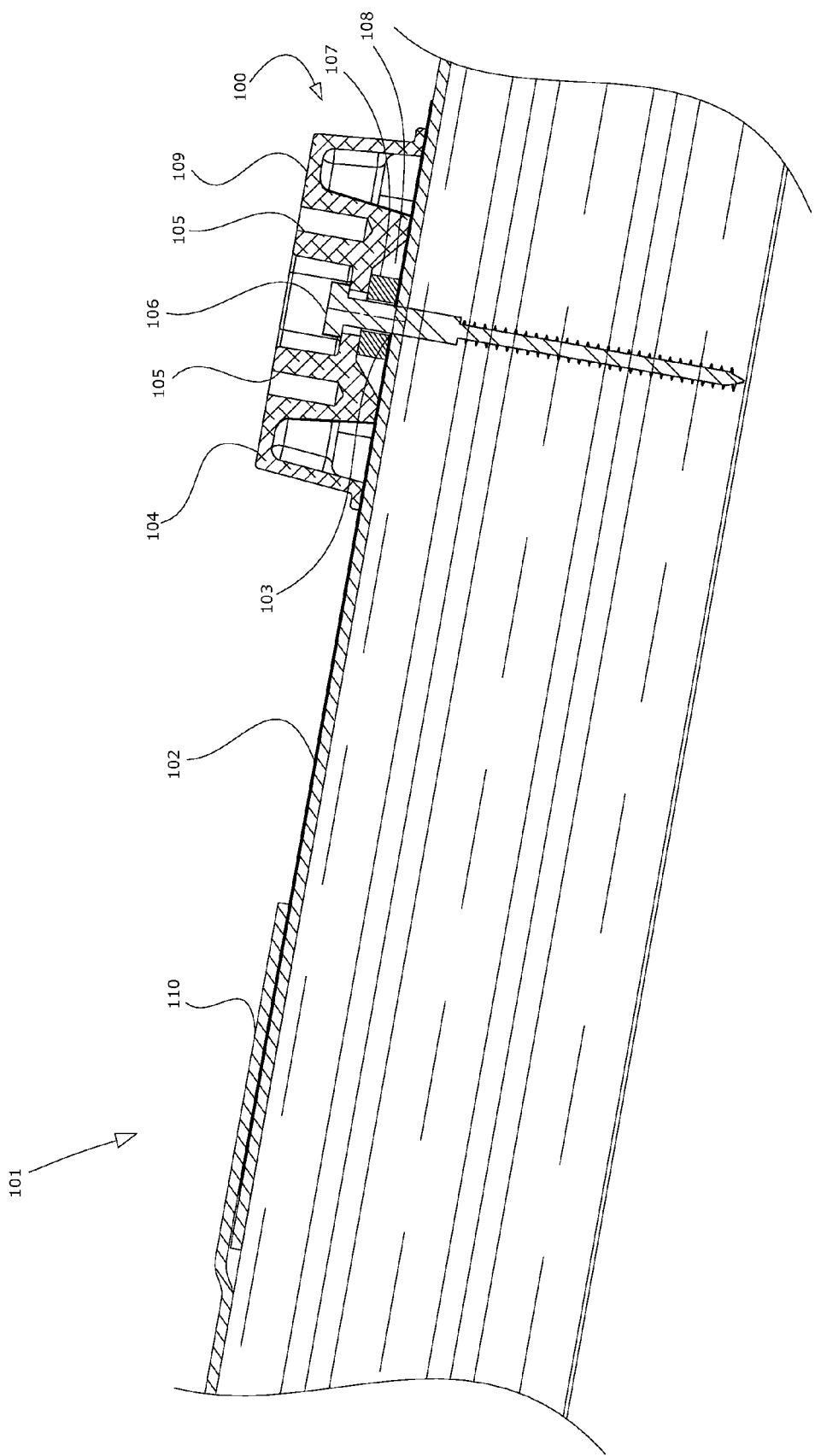
FIG. 1 is a cross-section cut through of an attachment system for solar equipment, such as is shown in FIG. 2, which is mounted on a support structure, such as a roof.

Referring to FIG. 1, and more generally in the other figures wherein the same reference numerals refer to like components in the various views, there is illustrated a new and improved attachment system for solar equipment, such as but not limited to photovoltaic and solar thermal panels or modules and ancillary apparatus, generally denominated 100 herein. Other solar equipment may include, but not be limited by, thermal solar arrays, electrical equipment, ancillary supporting and connecting apparatus (such as one or more inverters, wires, conduits, interlocks, feet, snow dams, wind diffusers, cosmetic screens, measurement equipment, and other devices as are known in the art). While various terms may have their ordinary meaning or particular meaning in the art, for ease of understanding there is provided herein, both below and at other locations in this specification, a non-limiting explanation as to the minimum scope intended for understanding of the present specification. Terms may be in singular or plural or any tense while retaining the same general meaning. Photovoltaic is often abbreviated as "PV". PV laminate refers to an encapsulated group of solar cells. Frame refers to a group of frame members (typically four for a rectangular-shaped, including square-shaped, PV module) which support and provide rigidity to a PV laminate. PV module refers to a single, one-piece, individually deployable electricity generating device comprising a PV laminate, a frame, and at least two output conductors. A PV array refers to a group of PV modules which are deployed together and are a part of the same electricity generating system. A mounting rail or strut is a structural member which connects to the bottom of a PV module via the use of a separate fastener (such as a bolt, clamp, or the like) and which serves to mechanically link two or more PV modules together, thereby providing structural support for the modules and also providing a means for connection to a mounting surface. An attachment system may comprise various components that work together to secure or attach solar panels to a support structure such as a roof, ground mounted rack, wall, vehicle, boat, or building surface. Certain attachment systems may further comprise at least one flashing device that allows attachment to a support structure through a water-resisting membrane without substantially altering the ability of the membrane to resist water intrusion. A flashing device may include a substantially flat flashing plate for interleaving with roofing materials (such as shingles, tiles, etc.), a support portion for connecting to a bracket, adaptor, connector, clamp or PV module, a fluid restrictor (such as a grommet, sealing ring, gasket, etc.), a lag screw or bolt, and a washer as will be described in more detail below.

FIG. 1 is a section side view of an attachment system for solar equipment, sometimes referred to as a flashing device, such as flashing device 100 for mounting a PV module, solar hot water module, or other solar device, to a support surface, such as the decking or rafters of a roof, which may typically be a sloped roof with shingles 110 or tiles 110, such as roof 101. Flashing devices are generally composed of: a water shielding, or flashing plate made of sheet metal, plastic, fabric, composite or a combination of materials, or other suitable material(s), such as flashing plate 102, with a hole, or aperture, such as hole 103 formed therein; a flashing block, support portion, flashing plate, plate, block, disc, disk, brick, hunk, ingot, mass, puck, slab, lump, stanchion, or the like, (most commonly referred to herein as a "puck", "support portion", or "block") such as block 104, which is mounted on top of the shielding or flashing plate 102 and may have connection directly to the underlying support structure, such as roof 101, and which contains a structure, system or other means to attach other devices as by a threaded hole, threaded stud, or the like, such as threaded hole 105. Block 104 may also have a structure, system or other means to fasten block 104 to roof 101, said means possibly including one or more screws, bolts, rivets, or the like, such as lag screw, bolt or screw 106 which also passes through hole 103; and a waterproofing means, structure or system to prevent water from entering around screw 106 or through hole 103, said waterproofing means being, for example, a fluid restrictor which prevents fluid from flowing through or beyond an area; such a fluid restrictor may be a formed (including pre-formed) rubber (or similar quasi-solid or semi-solid material) seal, gasket, grommet, sealing grommet, rubber seal, sealant, sealing ring, or the like, such as seal 107, which may be compressed between flashing plate 102 and block 104 (shown compressed in FIG. 1). Block 104 (and other embodiments of support portions or blocks, as disclosed below) has a roofward-facing (opposite to skyward facing) gap, chamber or aperture 108 which houses or retains a fluid restrictor portion, such a portion or the entirety of seal 107. Block 104 (and other block embodiments) also has a raised platform portion with a skyward facing connecting portion or substantially flat surface 109 (there may be convolutions or gaps, as shown, in the skyward facing surface 109, so long as the overall global area at or near the top of the block 104 provides a skyward facing essentially flat surface). Additionally, a fluid restrictor portion, which may be seal 107 or a portion of seal 107 (or another embodiment of a seal, or portion of a seal, as disclosed below) is located between said substantially or essentially flat surface 109 and said support portion, such as roof 101 or flashing plate 102. Further, during mounting of flashing device 100 to a support surface, such as roof 101, rotation of the fastener, such as screw 106 advances the screw into the roof 101 while rotating or advancing of the fastener also varies an amount of compression of said fluid restrictor portion, such as a portion of seal 107.

A quasi-solid or semi-solid, while similar to a solid in some respects (it can often support its own weight and/or hold its shape), also shares some properties of fluids, such as shape conformity to another article applying pressure to it, or the ability to flow under pressure. Quasi-solids may also be known as amorphous solids because microscopically they may be disordered, unlike traditional crystalline solids. A quasi-solid or semi-solid is considered intermediate in properties, (having a viscosity and rigidity intermediate between that of a solid and a liquid) examples of a quasi-solid or semi-solid substance, include putty, gelatin or gel, stiff colloids, silicone rubber, organic rubber, and many deformable plastics/polymers.

Figure 8:
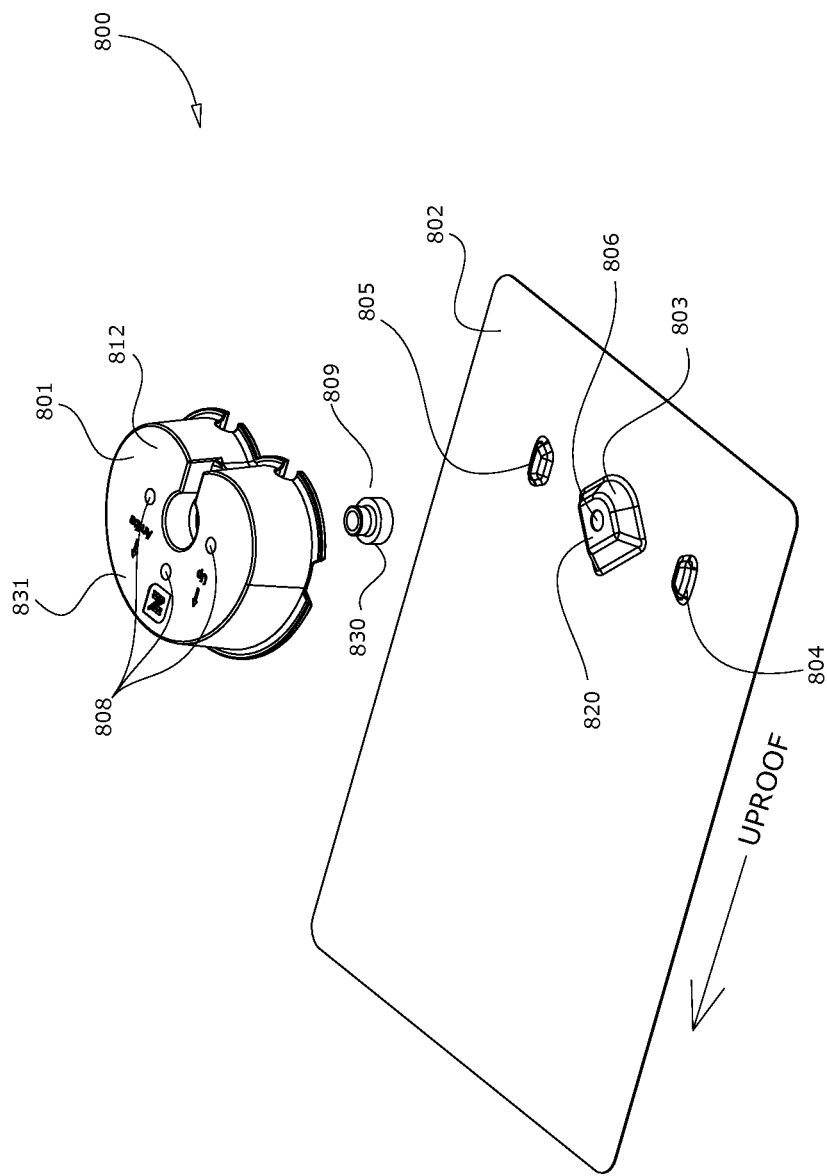
FIG. 8 is an isometric exploded view of another further embodiment of an attachment system for solar equipment.

Seal 107 is shown having an essentially cylindrical shape, however many alternative embodiments are explicitly considered, with many shown further herein. Some such embodiments include (usually pre-formed) shapes having an essentially flat upper and lower circular surface with an area between of smaller circumference such as shown in essentially spool or reel shaped fluid restrictor or seal 207 in FIG. 2; or a frustum (the basal part of a solid cone or pyramid formed by cutting off the top by a plane, usually parallel to the base (sometimes called a frusto-conical section) which may be oriented with the narrower (smaller diameter) pointing in any direction) which may have an essentially flat upper circular surface extending with a diameter greater than the narrower end portion (as shown in fluid restrictor or seal 507 in FIG. 2) or without any additional circular surface (not shown) or having a flat upper circular surface extending with a diameter less than the narrower end portion (not shown). Other fluid restrictor or seal embodiments are shown in FIGS. 8, 9, and 9A at seal 809, seal 508 in FIG. 5, seal 602 in FIG. 6, and elsewhere below.

During installation flashing plate 102 may be installed prior to installation of block 104 or along with it as flashing plate 102 and block 104 in the instant embodiment are separate objects that are only connected via final tightening down of lag screw 106. Other embodiments contemplate a one-piece design whereby flashing plate 102, block 104, and seal 107 are deployed as a single pre-connected part.

Figure 2:
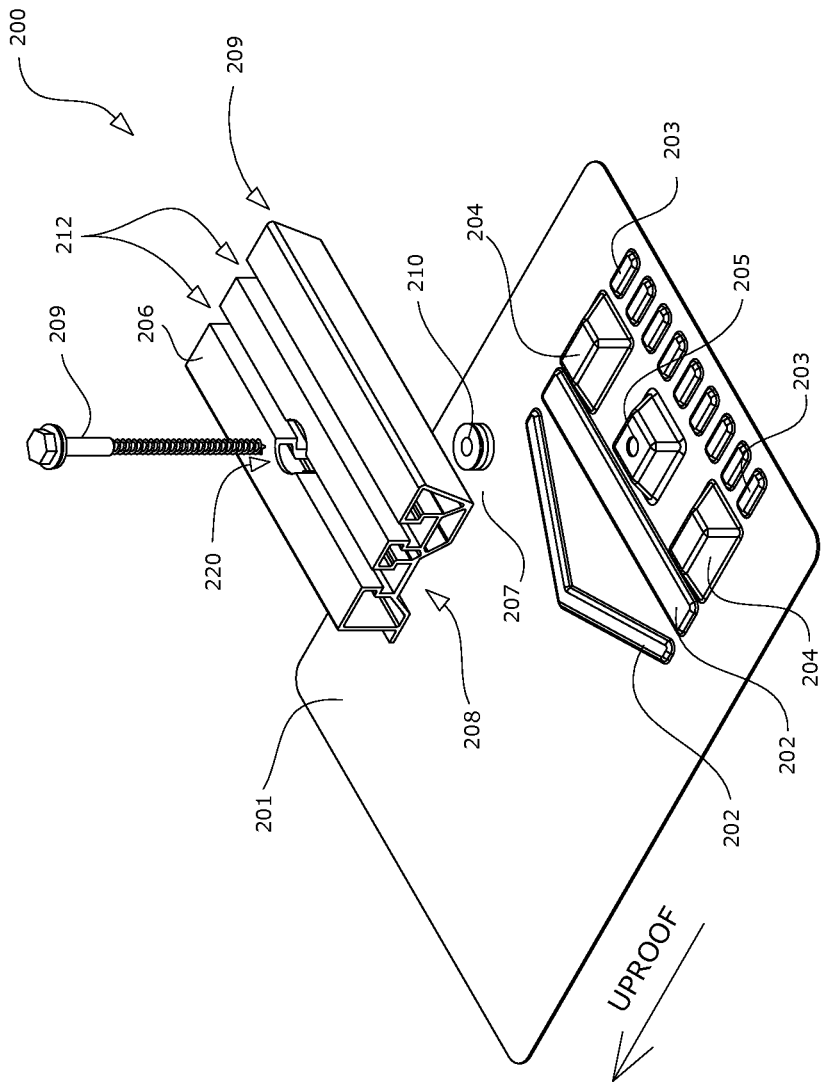
FIG. 2 is an isometric exploded view of an attachment system for solar equipment.

FIG. 2 is an isometric exploded view of flashing device 200, which is similar to flashing device 100, but which illustrates additional features and improvements. As shown in the embodiment of FIG. 2, flashing plate 201 may contain one or more raised features, such as ridges, embossments, fins, or bumps 202, 203, and 204 to further direct and control the flow of liquid, such as water flows down-roof, away from and around hole 205. It should be noted that bumps 203 may be shaped such that water that seeps between flashing plate 201 and block 206 may escape between bumps 203. Bumps 204 are designed to engage with or contact the bottom of block 206 so that block 206 cannot rotate with respect to flashing plate 201. Block 206 is designed such that the installer has multiple locations to choose from for attaching a bracket, foot, leg, PV module, or the like to block 206, the benefit of which will be illustrated further, especially with regard to FIG. 4 and further embodiments. In the present embodiment of FIG. 2, block 206 is shown as an extrusion of aluminum or other rigid or semi-rigid material (such as steel, plastic, composites, or the like) with t-slots into which may be slid a nut or bolt head. However, it should be noted that block 206 could take any number of forms, including, but not limited to, a die cast or forged block with threaded holes, a stamped sheet metal bracket with threaded studs, a machined block with t-slots 212 or threaded holes, or the like; with further embodiments of blocks disclosed below. Flashing device 200 also has an essentially spool or reel-shaped fluid restrictor, grommet or seal 207 with aperture 210 for screw 209. Grommet 207 may be pre-installed in block 206 with a the roofward-facing portion protruding from the bottom of aperture 220 in block 206 and the skyward facing portion protruding from the top of aperture in block 206 (see FIG. 3 as bottom and top of aperture 220 are not visible in FIG. 2 given the counter-bores as shown).

Block 206 (and other embodiments of support portions or blocks, as disclosed below) has a roofward-facing (opposite to the skyward facing) channel, gap, chamber or aperture 208 which retains a fluid restrictor portion, such a portion or the entirety of seal 207. In some embodiments, including as is shown in FIG. 2, aperture 208 is shaped to receive and retain a resilient fluid restrictor portion. Block 206 (and other block embodiments) also has a raised connecting portion with a skyward facing essentially or substantially flat surface 209 (even though it contains gaps or depressions in the surface). Additionally, a fluid restrictor portion, which may be seal 207 or a portion of seal 207 (or another embodiment of a seal, or portion of a seal, as disclosed below) is located between said substantially or essentially flat surface 209 and said support portion, such as roof (not shown) or flashing plate 201. Further, during mounting of flashing device 200 to a support surface, such as roof (not shown), rotation of the fastener, such as screw 209 advances screw 209 into the roof while rotating or advancing of the fastener also varies an amount of compression of said fluid restrictor portion. Assembly of this embodiment occurs by passing the shaft of screw 209 through a preformed hole 220 in block 206, through a preformed hole 210 in seal 207, through hole 205 in flashing plate 201 and into a support structure, such as a roof (not shown).

Figure 3:
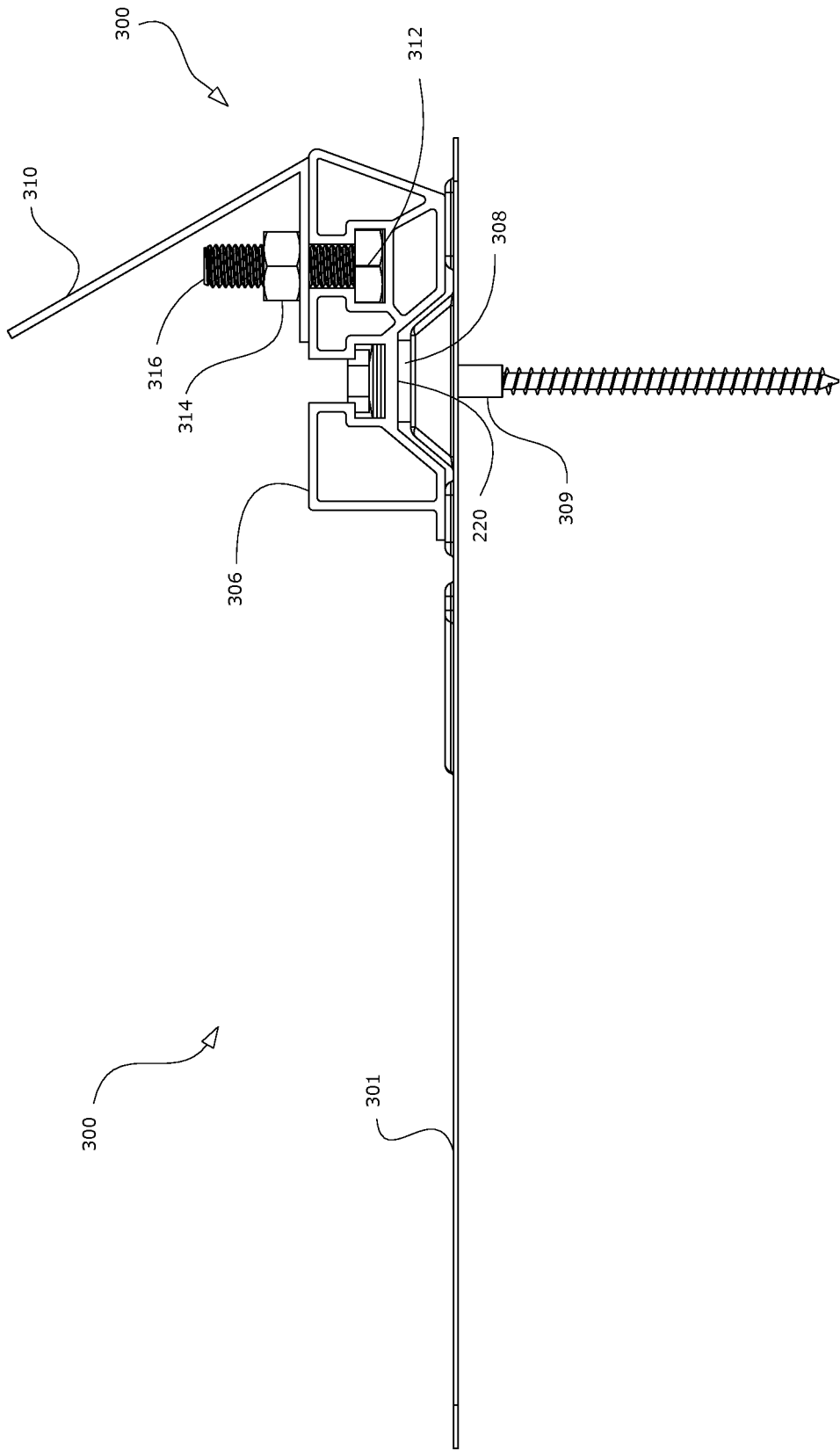
FIG. 3 is a section side view of a flashing device similar to the one shown in FIG. 2 along with a cosmetic screen.

FIG. 3 is a section side view of a flashing device similar to the one shown in FIG. 2. Flashing device 300 is secured to a support surface, such as a roof (not shown) by advancing screw 309 through block 306 and through aperture 308 formed therein to receive and retain a resilient fluid restrictor portion (not shown) and through flashing plate 301 into the roof. The instant embodiment further includes an ancillary device, structure, apparatus or the like, such as skirt 310 (which may be used as a fluid (such as air) baffle, for fire protection, for cosmetic and/or other reasons as understood by one with skill in the art) mounted or attached to block 306 by a fastening device, such as nut 314 and bolt 316, the head of bolt 316 may be partially or fully contained in t-slots 312 fashioned in block 306. In other embodiments skirt 310 may be replaced by other types of PV system equipment such as electrical equipment, ancillary supporting and connecting apparatus, inverters, wires, conduits, interlocks, feet, snow dams, wind diffusers, cosmetic screens, measurement equipment, and other solar-related devices as are known in the art.

Figure 4:
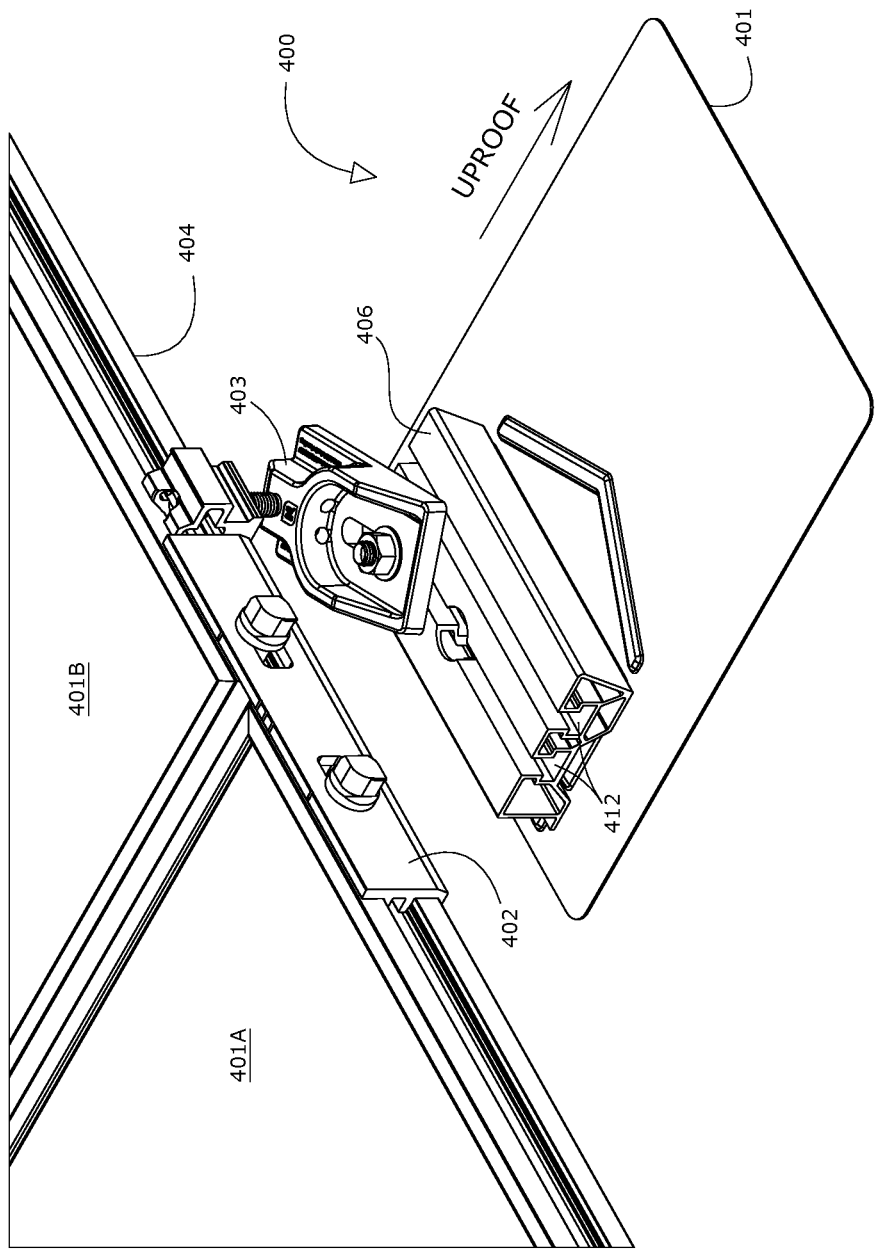
FIG. 4 is an isometric view of a pair of PV modules interconnected to each other by an interlock, with a leveling foot connected to the frame of one of the PV modules and to a flashing device.

FIG. 4 is an isometric view of a pair of PV modules 401A and 401B interconnected to each other by interlock 402, with bracket or leveling foot 403 connected to the frame 404 of PV module 401. Leveling foot 403 is mounted to flashing device 400, which is similar in form to previously disclosed flashing devices 100, 200 and 300 with block 406 being similar in form to blocks 104, 206 and 306. As can be seen in FIG. 4, interlock 402 is in a position that directly blocks, inhibits or conflicts with a potentially desirable position of leveling foot 403 (connecting to frame 404 directly above block 206). As PV modules 401A and 401B may not easily be moved or repositioned, it may be desirable to locate or place leveling foot 403 in a position that allows connection to one of the PV modules. In the present embodiment, one or more t-slots 412 in block 406 allow leveling foot 403 to be located and connected toward the edge of block 406 and avoid being blocked by interlock 402. As with the other described embodiments, block 406 is secured to flashing plate 401 and may be secured to a roof or other support surface (not shown).

Figure 5:
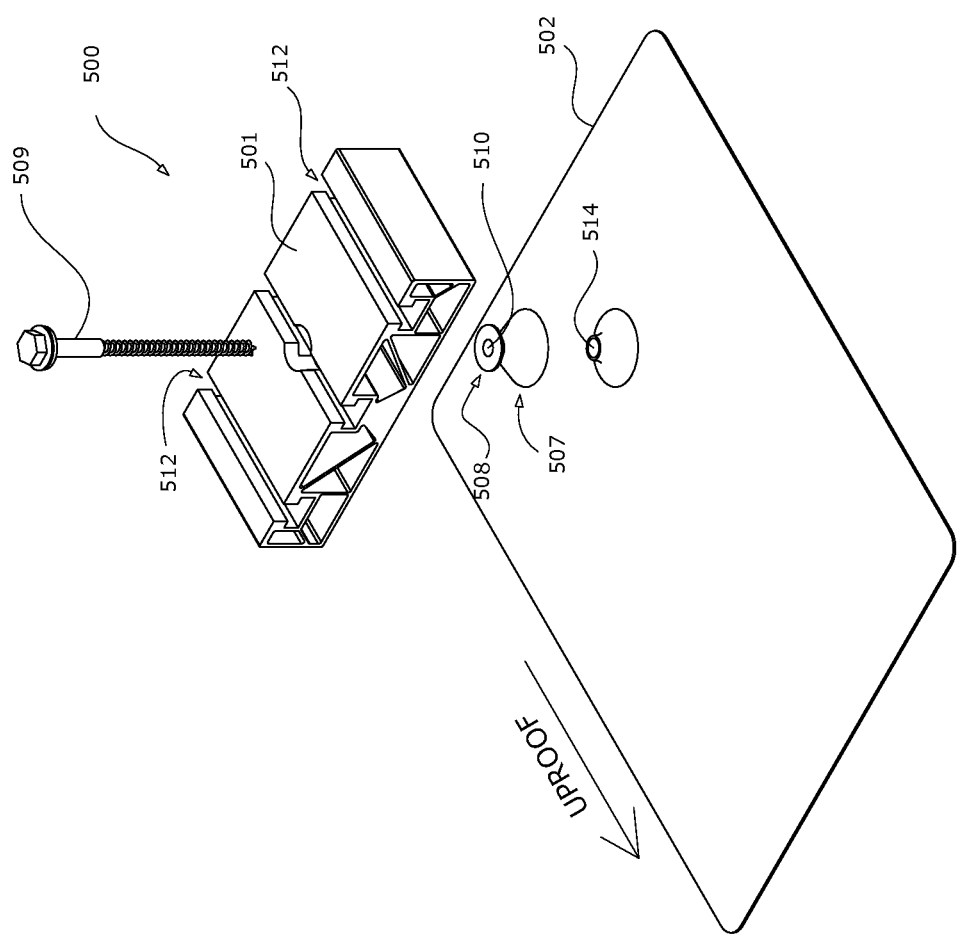
FIG. 5 is an isometric exploded view of another embodiment of an attachment system for solar equipment.

FIG. 5 is an isometric exploded view of another embodiment of a flashing device, flashing device 500, which is similar in form to previously disclosed flashing devices 100, 200, 300 and 400. Block 501 is shown as an aluminum (or other material) extrusion, similar in form to blocks 104, 206, 306 and 406, with t-slots 512 oriented parallel to the roof pitch to allow positional adjustment of an attachment or apparatus (such as a mounting foot, skirt, or other device) in a direction that is essentially parallel to the roof pitch. Multiple t-slots 512 provide positional adjustment in a direction essentially perpendicular to the roof pitch. Other embodiments contemplate directions for slots 512 that are at an angle other than 90° to the roof pitch. Also shown is yet another embodiment of pre-formed seal 507, with this version being essentially a frustum or frusto-conical section, which may be oriented with the narrower (smaller diameter) pointing in any direction (but herein pointing essentially skyward when mounted to a roof) which may optionally have an essentially flat upper circular surface 508 extending with a diameter greater than the narrower end portion of the frustum. As with the other described embodiments, block 501 is secured to flashing plate 502 and may be secured to a roof or other support surface (not shown) by screw 509 passing through a preformed hole in block 501, through preformed hole 510 in seal 507, through a preformed hole 514 in flashing plate 502, and into a roof or other support surface (not shown).

Figure 6:
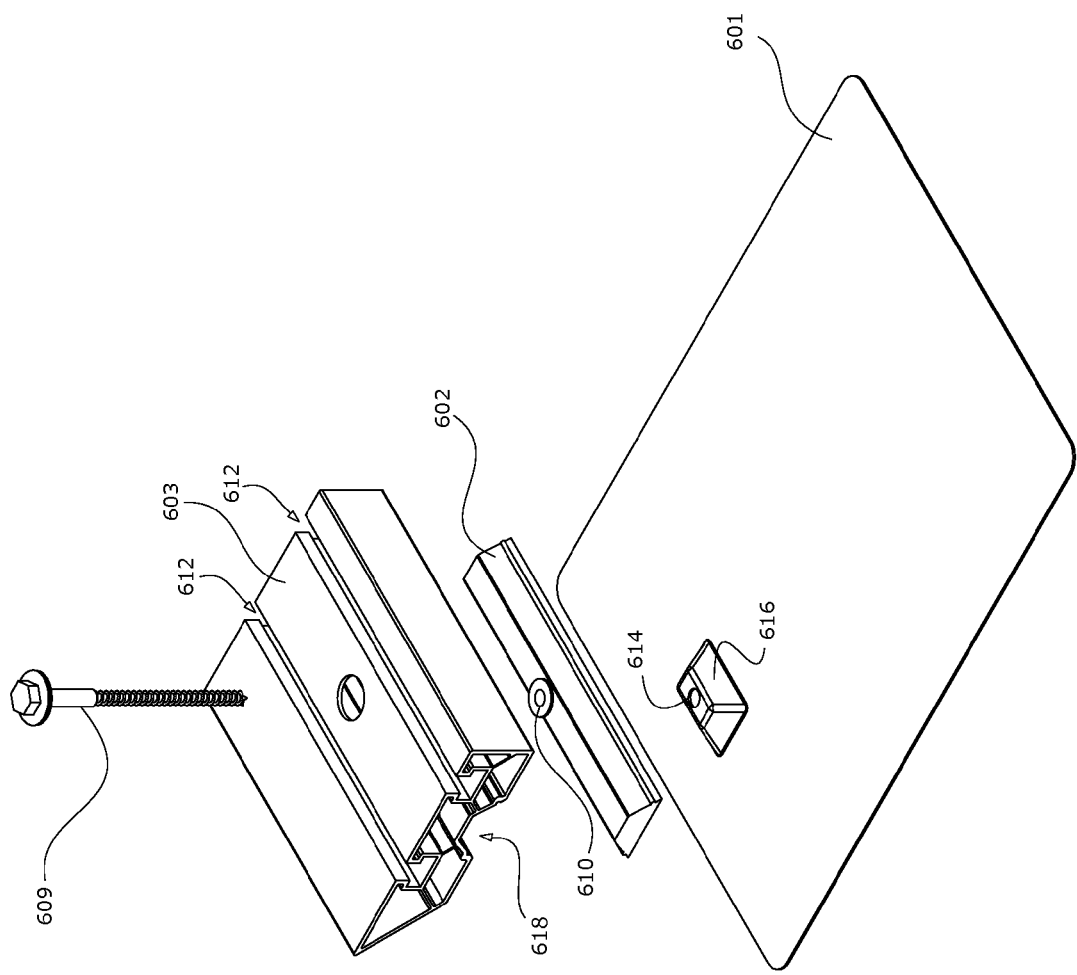
FIG. 6 is an isometric exploded view of yet another embodiment of an attachment system for solar equipment.

FIG. 6 is an isometric exploded view of yet another embodiment of a flashing device, flashing device 600 which is similar in form to previously disclosed flashing devices 100, 200, 300, 400 and 500. Flashing device 600 is provided with only one raised portion or bump 616 on flashing plate 601. Seal 602 is designed to fill essentially the entirety of the space between block 603 and flashing plate 601, thereby blocking infiltration of water along the entire length of seal 602. Block 603 is similar in form to blocks 104, 206, 306, 406 and 501, with t-slots 612 oriented substantially perpendicular to the roof pitch to allow positional adjustment of an attachment or apparatus (such as a mounting foot, skirt, or other device) in a direction that is essentially perpendicular to the roof pitch. As with the other described embodiments, block 603 is secured to flashing plate 601 and may be secured to a roof or other support surface (not shown) by screw 609 passing through a preformed hole in block 603, through preformed hole 610 in seal 602, through preformed hole 614 in flashing plate 601, and into a roof or other support surface (not shown). Further, block 603 has a roofward-facing (opposite to the skyward facing) channel, gap, chamber or aperture 618 which retains a fluid restrictor portion, such as seal 602 since aperture 618 is shaped to receive and retain resilient fluid restrictor portion, being seal 602. Raised portion 616 comprises a substantially flat platform portion 618 for providing a reliable seal between seal 602 and flashing plate 601.

Figure 7:
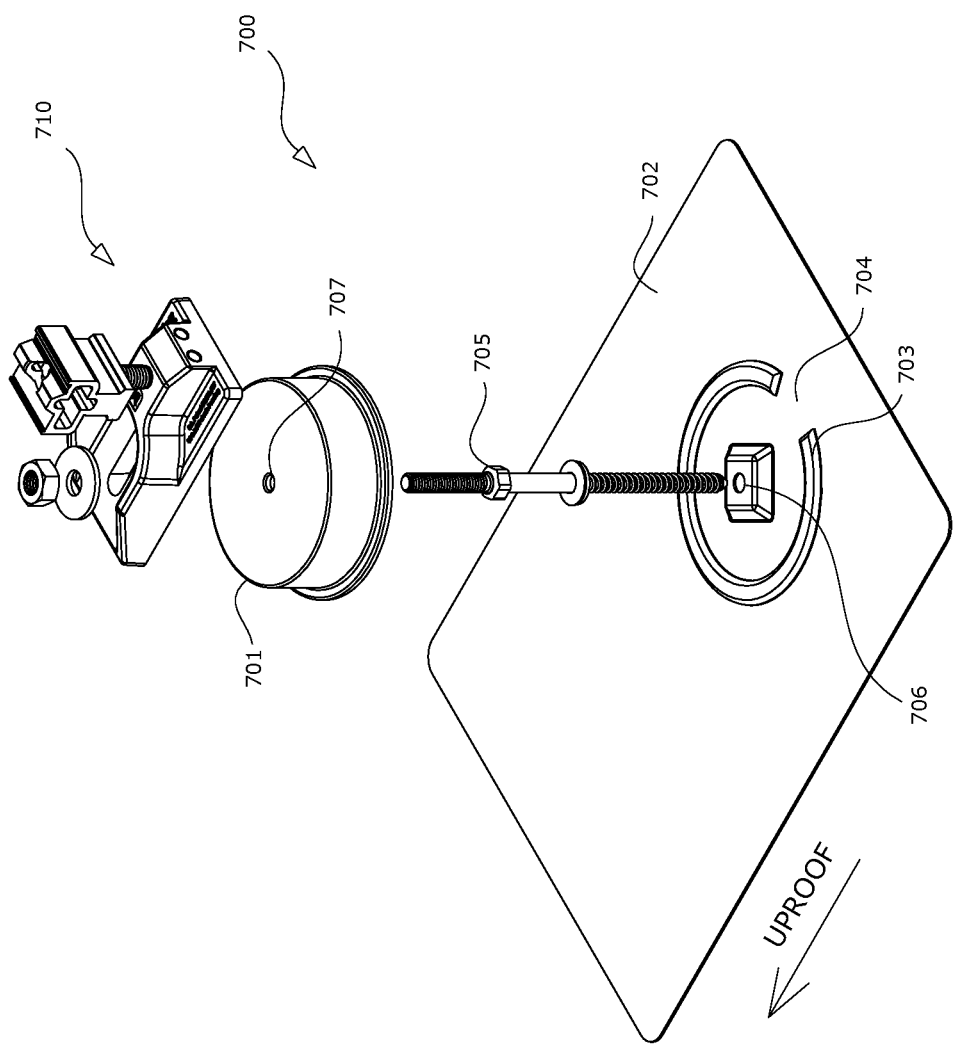
FIG. 7 is an isometric exploded view of a further embodiment of an attachment system for solar equipment.

FIG. 7 is an isometric exploded view of a further embodiment of a flashing device, flashing device 700. Block 701 is shown as essentially circular in top view, but may be any generally regular shape including a triangle, square, rectangle, pentagon, hexagon or other many sided shapes in top view, and may be die cast or forged, or made in another manner. Block 701 may have parallel sidewalls or tapering (either angled inwards towards sunward or towards roofward, or any combination). Flashing plate 702 includes bump features 703 that match the shape of block 701, but with an outlet for water to escape at gap 704. In the present embodiment, hanger bolt or screw 705 is installed through hole 706 in flashing plate 702 prior to installing block 701. Hanger bolt 705 is configured with additional machine threads that protrude perpendicular to the roof surface (not shown). Block 701 contains threaded hole 707, such that block 701 may be installed on hanger bolt 705, rotating until block 701 is in firm contact with flashing plate 702. Alternatively, hole 707 may not be threaded, and/or the distal end of hanger bolt 705 furthest from the roof surface may not be threaded, allowing for the upper portion of the distal end of hanger bolt 705 to slide through hole 707. A bracket or leveling foot 710 or other device, such as a bracket (not shown) may then be attached to the remaining portion of screw 705 which extends through hole 707. Block 701 may also contain one or more additional, usually threaded, holes (not shown) for alternative mounting locations for aforementioned brackets or leveling feet.

FIG. 8 is an isometric exploded view of another embodiment of a flashing device, flashing device 800 (a lag screw, such as screws 106, 209, 309, 509, 609, is not shown in this figure for clarity). Flashing device 800 contains block 801, which may be forged, machined, or die-cast, or otherwise formed, though it should be noted that block 801 is of a shape that is optimized for maximum flexibility at minimum material, which is best suited for net shape processes such as die casting. Block 801 may have parallel sidewalls or tapering (either angled inwards towards sunward or towards roofward, or any combination). The cardioid shape shown provides optimal flexibility for the mounting of a leveling foot (not shown), such as leveling foot 403 in FIG. 4 or leveling foot 710 in FIG. 7, such that a leveling foot can be located in one or more positions that avoid a conflict with an interlock, such as interlock 402, as illustrated in FIG. 4. Block 801 is shown with 3 locations of holes 808 on a connection portion 831 that would assist placement of a leveling foot, with suitable space around the hole to permit multiple orientations of the foot placement on the top surface 812 of block 801, as disclosed in further detail especially in relation to FIG. 10; any number of holes, such as 1, 2, 3, 4, 5, 6, 7 or other integer number, may be provided and are explicitly contemplated and disclosed herein. Flashing plate 802 includes raised portion or bump 803 to direct water around hole 806, and bumps 804 and 805 which engage with gaps (not shown) on the bottom of block 801 to prevent rotation of block 801 with respect to flashing plate 802. Flashing device 800 is also provided with a seal 809 shown as a half-spool or half-reel shaped fluid restrictor or seal 809. Raised portion 803 may comprise a substantially flat platform portion 820 for providing mating engagement with a bottom surface of seal 809 at flange 830. Like-shaped, flat surfaces, platform 820 and flange 830, provide an improved sealing mechanism relative to prior art attempts as will be discussed further below.

FIG. 9 is a section side view of flashing device 800 shown in FIG. 8, with a section close-up view at FIG. 9A of seal 809 installed in block 801. Seal 809 may be installed into block 801 prior to installation on the roof. Seal 809 is shaped with a taper such that it can be pushed into block 801, and the taper fit will prevent seal 809 from falling out of block 801. The interior surface (of the hole) in seal 809 may be essentially the same diameter as or smaller than the shank or shaft of the screw 810 which penetrates the seal to permit a snug fit, or the interior surface (of the hole) in seal 809 may be of a larger diameter to permit ease of sliding the seal over the shank or shaft of screw 810, or some portions of the hole may contact or not contact the shank or shaft of screw 810; but in any case, the assembly operation, particularly the turning or advancing of screw 810 into a support surface, such as a roof, will compress seal 809 to form, create or increase the fluid sealing capability of seal 809. More explicitly, when seal 809 is compressed during installation and tightening of screw 810, the inward sloping taper 850 may cause seal 809 to compress against the shank or shaft of screw 810 as washer 813 exerts a downward force on seal 809. Such tightening of seal 809 around the shaft of screw 810 reduces the potential for water ingress through clearance hole 827 (see FIG. 10) in block 801. Compression of flange 830 as it is squeezed between a bottom surface of block 801 and platform portion 820 of flashing plate 802 reduces the potential for water ingress between flashing block 801 and flashing plate 802 then through hole 806 in flashing plate. Flange 830 may have a nominal thickness sized to ensure compression under varying tolerance conditions and angular misalignment of components as is typical in the field. It is contemplated that flange 830 may have a nominal thickness from 0.050" to 0.5" and a fully compressed thickness as thin as 0.010", depending on materials used. Seal 809 is shown in a compressed state in FIG. 9A.

Seal 809 may alternatively be configured with an annular ring or disc on the upper end of the taper, or cylinder, said ring protruding completely through the hole to retain seal 809 in block 801. Said ring would be compressed by screw 810 upon installation. Seal 809 is preferably made from a deformable rigid or semi-rigid material, such as a semi-solid or quasi-solid, that may form a fluid resistant or fluid proof (the fluid most commonly being water) seal, such as silicone, natural or synthetic rubber, EPDM rubber, poly vinyl chloride, elastomers, or the like. As noted briefly above, the interior surface of seal 809 is shown essentially touching the shaft of screw 810 along the length of seal 809, however other alternative embodiments are specifically contemplated and hereby disclosed, including (a) a close proximity (but not touching) of interior surface of a seal with the shaft of a screw, (b) a touching at one or more points along the length of the seal's interior, but not all points (such as one or more effective annular ring(s) of touching) such as by a varied diameter of interior surface of a seal (as disclosed in more detail below), and/or (c) an additional compressing into contact or additional or further contact as by rotating a screw, or by advancing a screw into (usually downward) into the support surface, such as a roof (as disclosed in more detail below). While each of the disclosed embodiments of a seal have one or more optional interior surface configurations (usually a diameter, such as an essentially cylindrical single-diameter interior surface shown for seal 809 in FIGS. 9 and 9A, or a multiple diameter seal as shown below) essentially any interior surface configurations may be used with any exterior surface configurations; for example an essentially cylindrical single-diameter (or alternatively a tapered, complex multiple diameter, or other) interior surface may be used with any of the essentially cylindrical seal 107, essentially spool or reel shaped seal 207, essentially frustum shaped seal 507, or any other exterior surface configurations of a fluid restrictor or seal.

Figure 10:
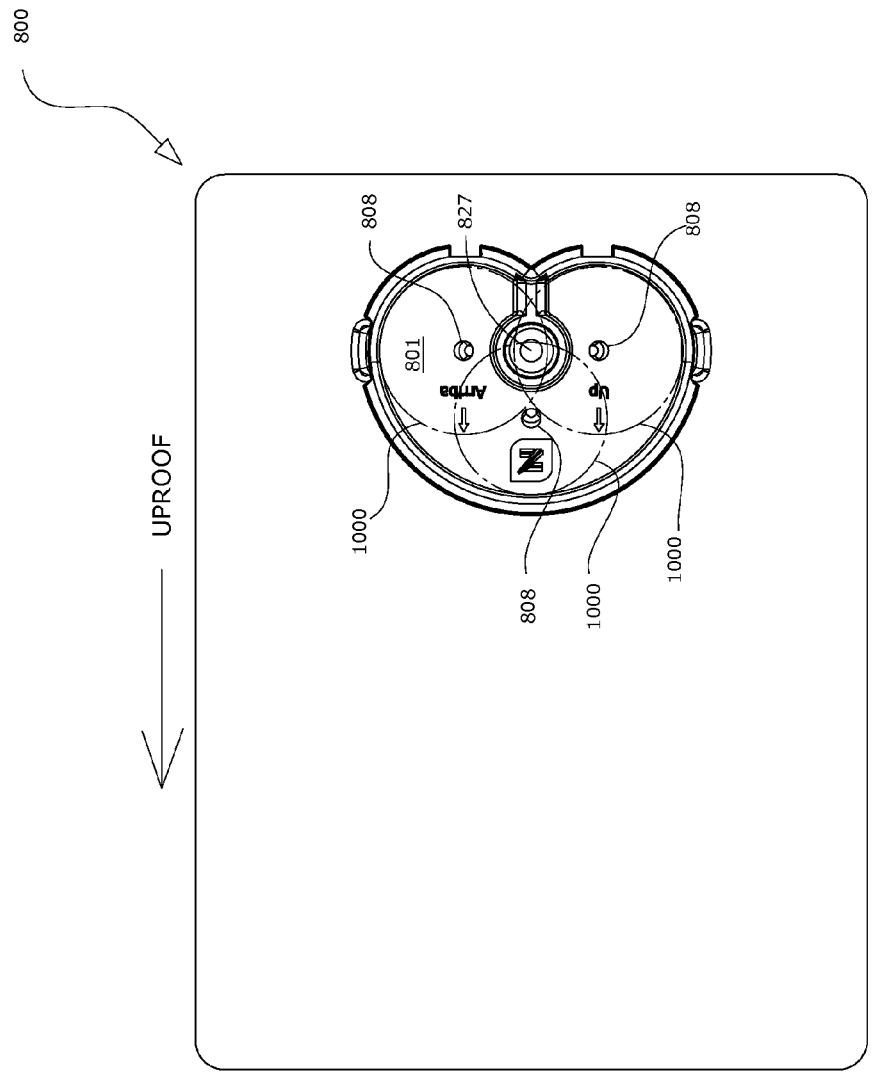
FIG. 10 is a top view of the attachment system for solar equipment shown in FIG. 8, more clearly illustrating the geometric construction of one embodiment of a support portion with a cardioid shape.

FIG. 10 is a top view of flashing device 800 to illustrate the geometric construction of an essentially cardioid shape. Three dashed circles 1000 are sketched concentric to the mounting holes on block 801. Circles 1000 represent one example of a minimum area required to support a specific bracket or leveling foot, such as leveling foot 403, to a given load value in a specific range of desired mounting positions. Other embodiments contemplate various brackets, fasteners, positions, and load values, therefore such other embodiments may have a minimum area circle different from circle 1000. However, flashing device 800, in general, contemplates the provision of substantially more distal support material around mounting holes 808 than prior art systems, as will be discussed below. As can be seen in FIG. 10, the cardioid shape approximately fits circles 1000. This geometric analysis is used to optimize the material used in the block, which can yield significant cost savings when using a material-additive process such as die casting.

Figure 10A:
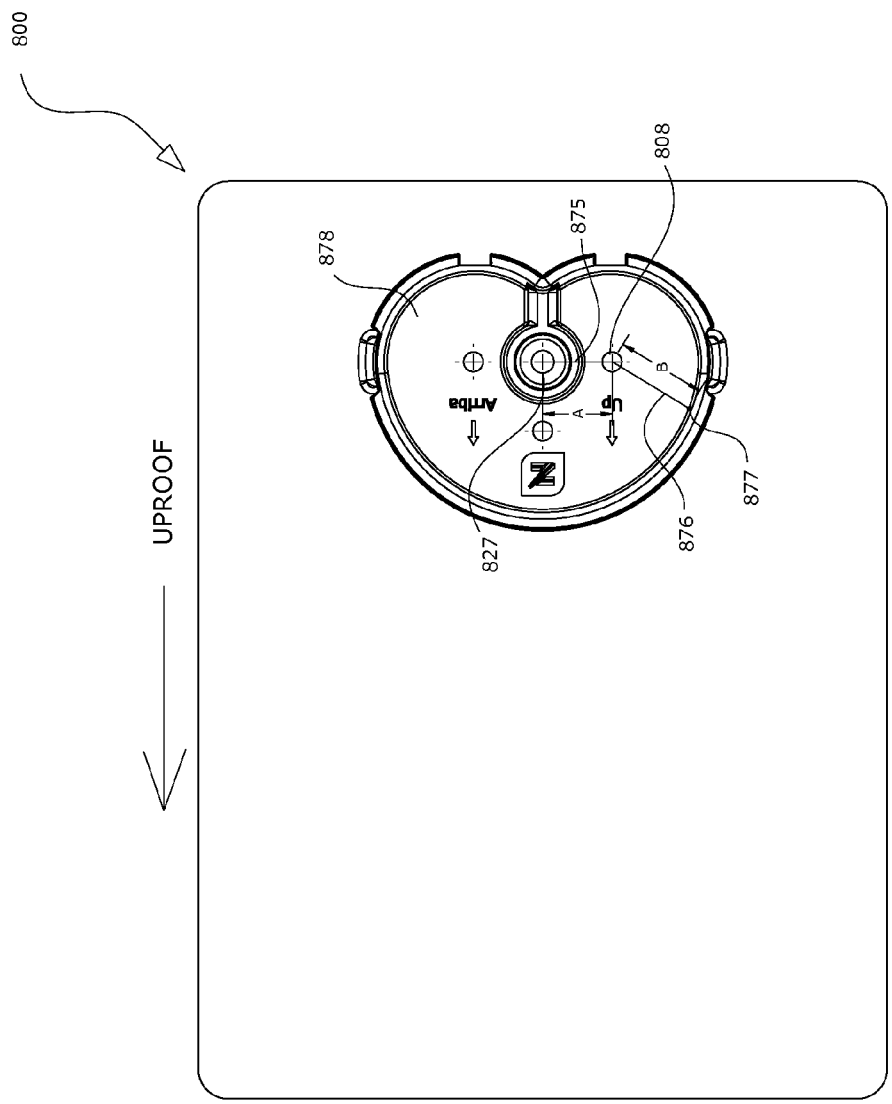
FIG. 10A is the same as FIG. 10 except different geometry is indicated relating to the location of holes and support material.
Figure 10B:
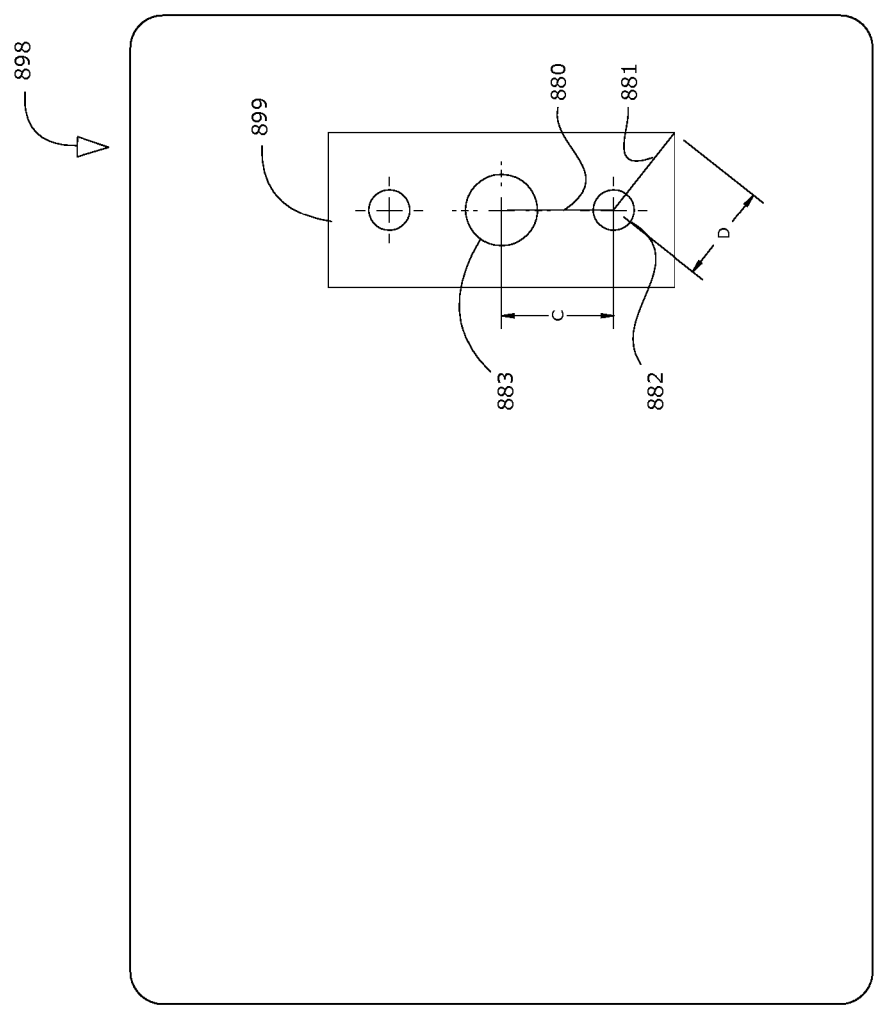
FIG. 10B is a top view of a prior art flashing device.
Figure 10C:
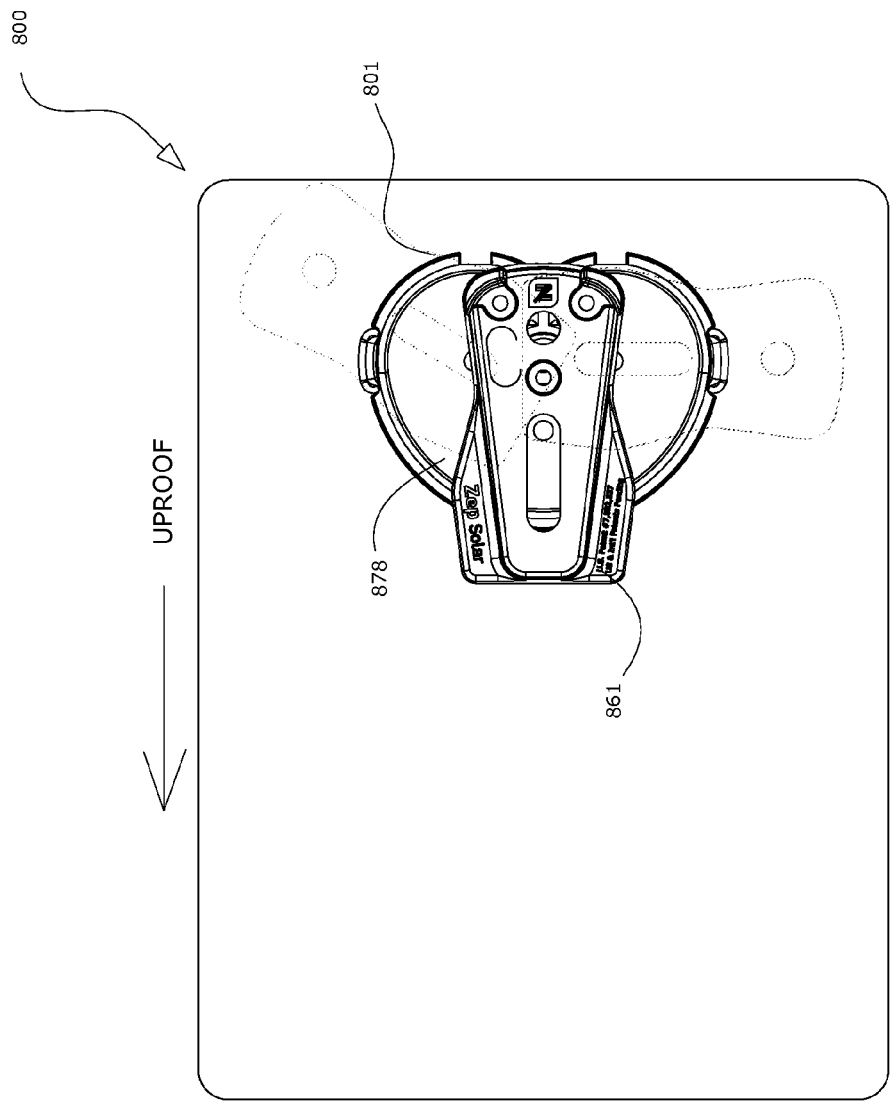
FIG. 10C is a top view of the flashing device of FIG. 10A further comprising a bracket and showing various positions of the bracket.

FIGS. 10A, 10B, and 10C provide further analysis regarding the structural optimization of flashing device 800. FIG. 10A shows how a length A of a line 875 from a mounting hole 808 center point to a center point of clearance hole 827 is less than a length B of a line 876 from the same mounting hole 808 to a distal supporting portion 877. The increased distal supporting material on the substantially flat, uppermost planar surface 878 of block 802 provides a significant increase in the load bearing capability of block 802 and, in general, in the load bearing capability of a solar panel or array connected to block 801 via a bracket connected to mounting hole 808 since the bracket, such as an L-bracket or a leveling foot 403, may have less material cantilevered off of the edge of block 801. One skilled in the art will recognize that line 876 may be drawn anywhere from 90 to 180 degrees, or −90 to −180 degrees, away from line 875 and still be longer than line 875. However, as shown in FIG. 10B, prior art flashing devices 898 comprise blocks 899 with significantly less support material distal to mounting holes 882. Line 880 with length C is clearly longer than line 881 with length D.

FIG. 10C further underscores the advantage of additional distal support material on support surface 878. A bottom portion of a bracket or foot 861 is shown in a top section view cut just above a lower portion of bracket 861 (fasteners are not shown for clarity). Bracket 861 is shown in dashed line for various alternate positions. One skilled in the art will recognize that bracket 861 is well supported in many different positions on block 801. Such positional flexibility may be very advantageous when mounting solar panels on a roof since roof conditions vary and, as discussed earlier, it may be required to avoid other systems components at times.

Figure 11:
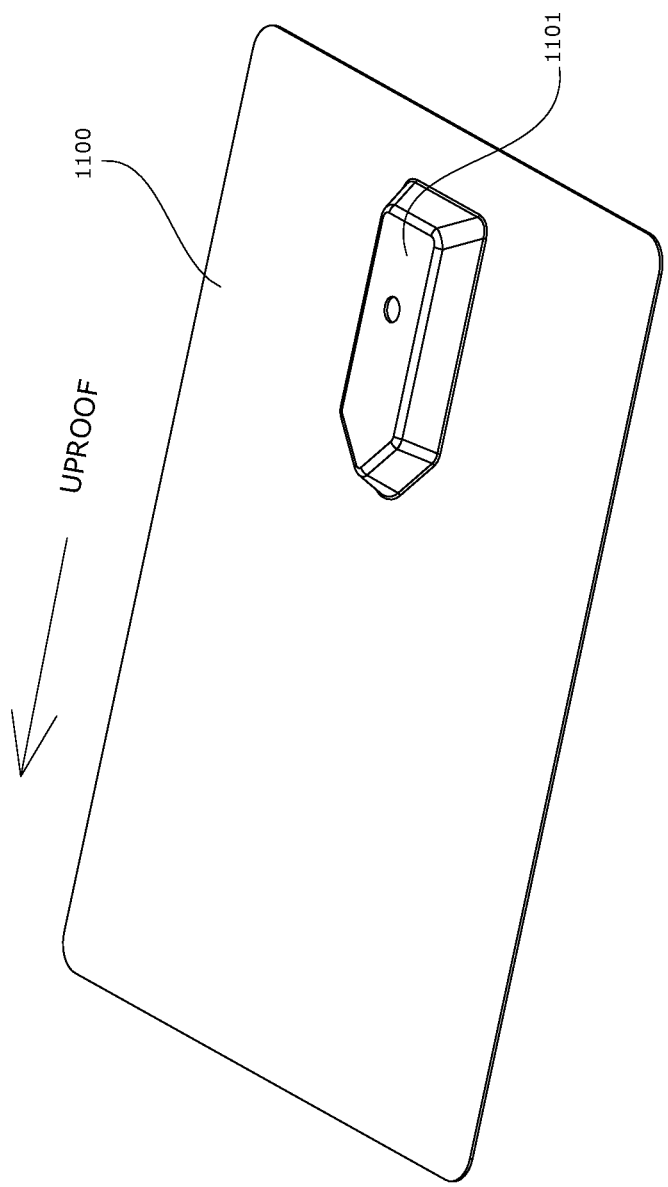
FIG. 11 is an alternative embodiment of a flashing plate.

FIG. 11 is an alternative embodiment of a flashing plate, flashing plate 1100, with bump or raised portion 1101, which is configured to provide water routing and anti-rotation of an associated block (not shown) with a single bump feature.

Figure 12:
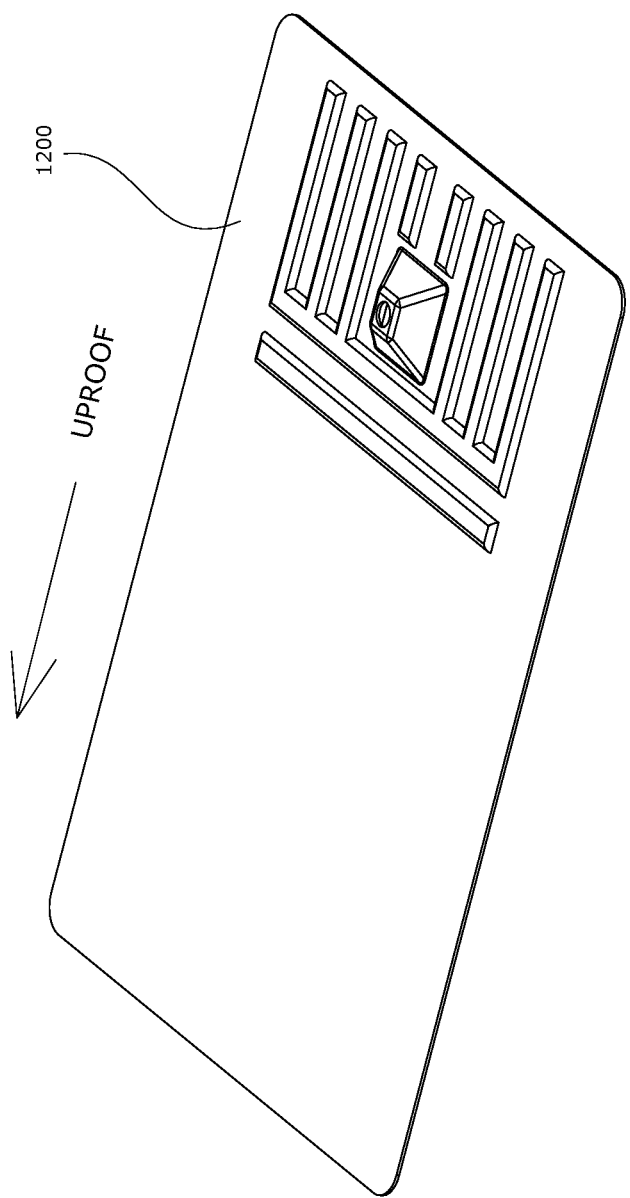
FIG. 12 is another alternative embodiment of a flashing plate.

FIG. 12 is another alternative embodiment of a flashing plate, flashing plate 1200, similar to flashing plate 201 in FIG. 2.

Figure 13:
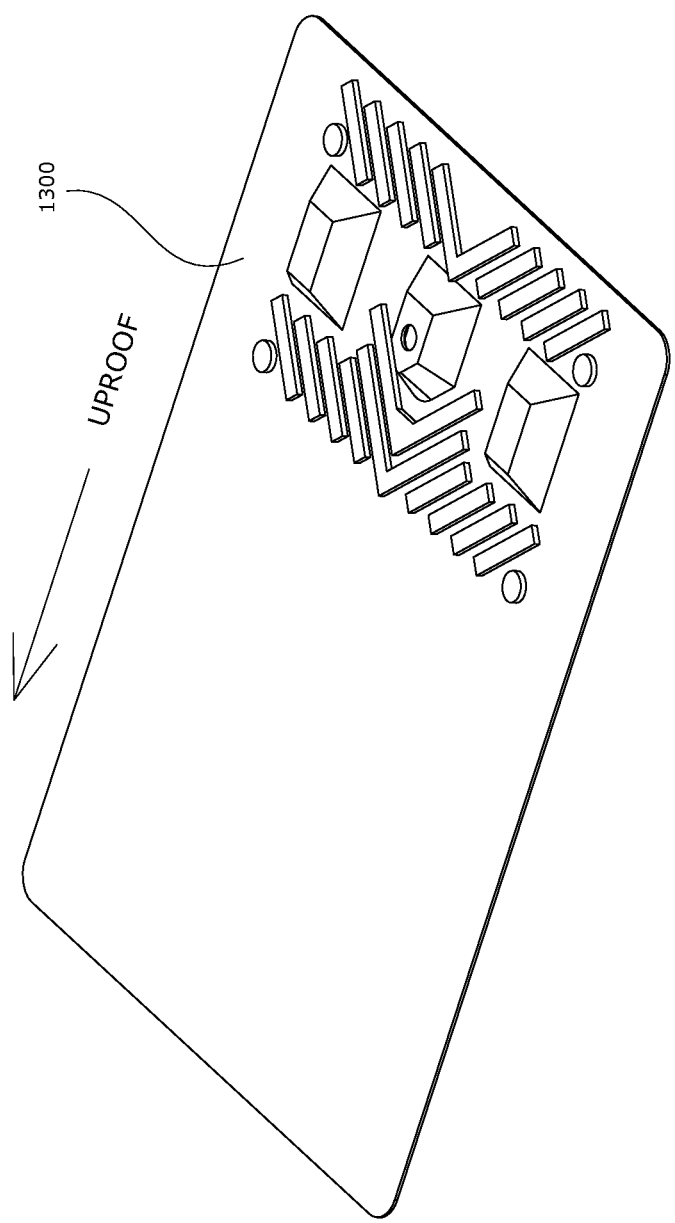
FIG. 13 is yet another alternative embodiment of a flashing plate.

FIG. 13 is yet another alternative embodiment of a flashing plate, flashing plate 1300, similar to flashing plate 201 in FIG. 2.

Figure 14:
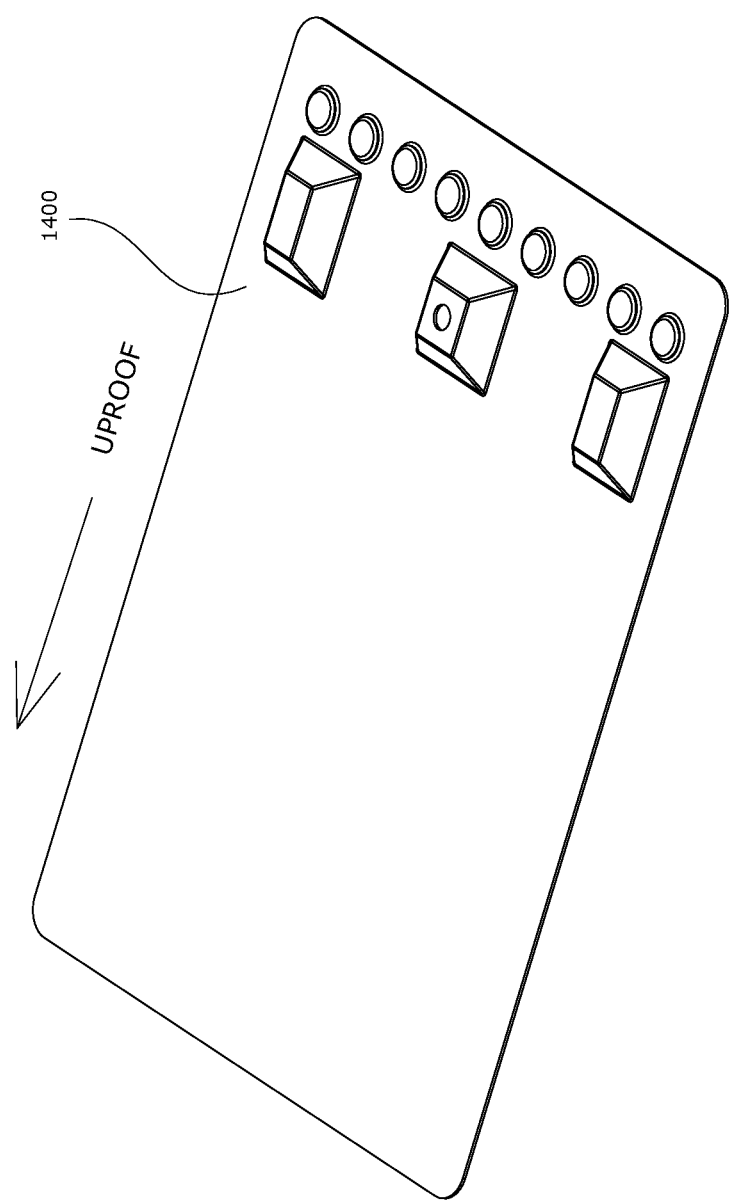
FIG. 14 is a further alternative embodiment of a flashing plate.

FIG. 14 is a further alternative embodiment of a flashing plate, flashing plate 1400, similar to flashing plate 201 in FIG. 2, but without the up-roof water routing bump. Instead, the associated block (not shown) effectively blocks the flow of water from up-roof to down-roof, and routes the water around the block.

Figure 15:
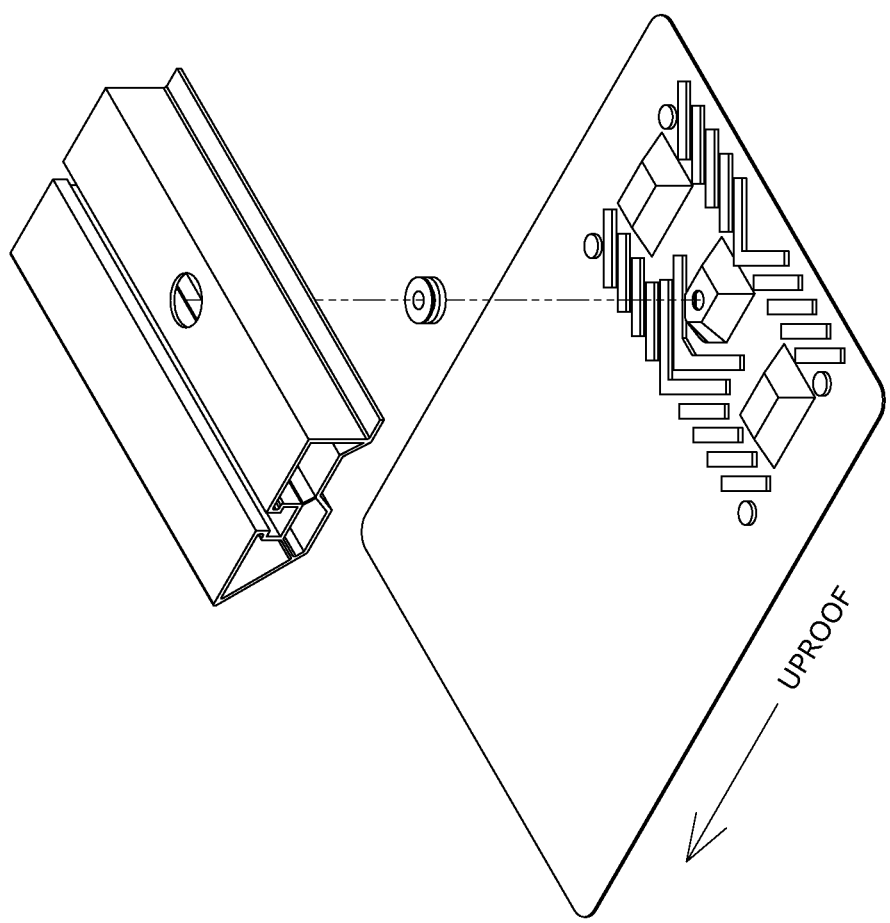
FIG. 15 is another further alternative embodiment of an attachment system for solar equipment with yet another further embodiment of a flashing plate.

FIG. 15 is another further alternative embodiment of an attachment system for solar equipment with yet another further embodiment of a flashing plate.

Figure 16:
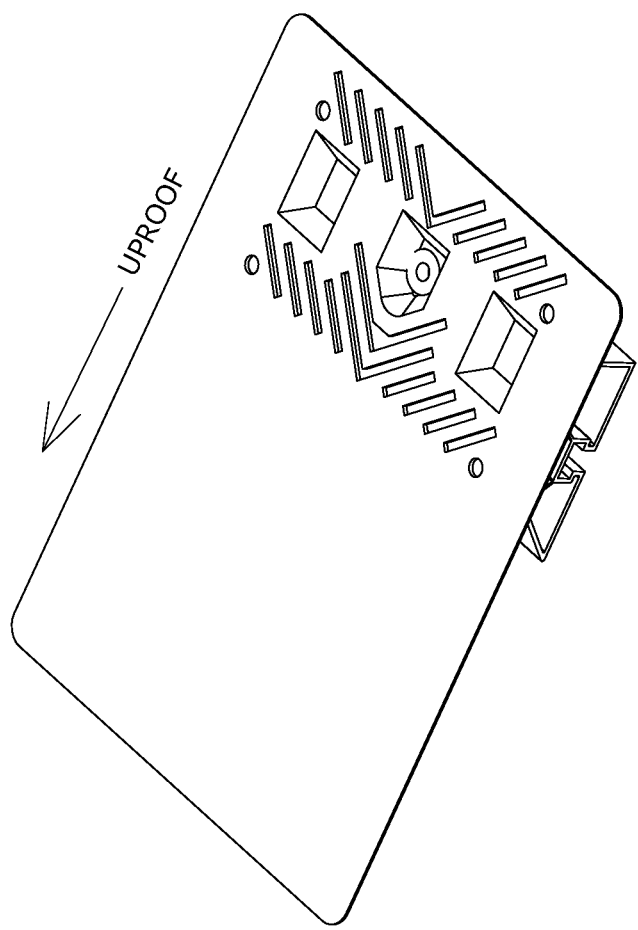
FIG. 16 is an inverted view of the flashing plate of FIG. 15.

FIG. 16 is an inverted view of the attachment system for solar equipment of FIG. 15 showing underside detail of the flashing plate of FIG. 15.

Figure 17:
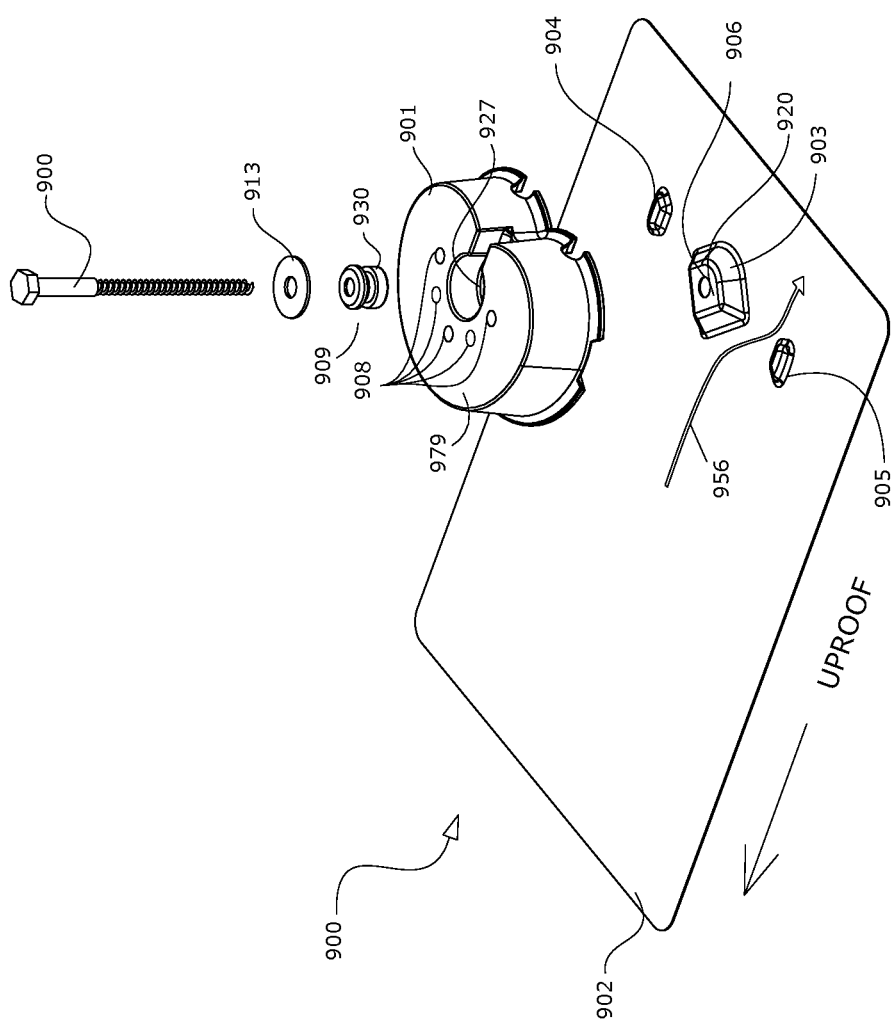
FIG. 17 is an exploded isometric view of an alternative embodiment of a flashing device.

FIGS. 17-21 show an embodiment of an attachment system comprising a flashing device 900. Flashing device 900 is similar to flashing device 800 and others described herein. FIG. 17 provides an isometric exploded view of another embodiment of a flashing device, flashing device 900. Flashing device 900 contains block 901, which may be forged, machined, or die-cast, or otherwise formed, though it should be noted that block 901 is of a shape that is optimized for maximum flexibility at minimum material, which is best suited for net shape processes such as die casting. The essentially cardioid shape shown provides optimal flexibility for the supporting of brackets as described above with reference to block 801. Block 901 is shown with 5 locations of holes 908 located on connecting portion 979 that would assist placement of a bracket or leveling foot, such holes being optimally placed to support brackets similar to holes 808 in block 801. Flashing plate 902 includes raised portion or bump 903 to direct water around hole 906, and bumps 904 and 905 which engage with gaps 955 on the bottom of block 901 to resist rotation of block 901 with respect to flashing plate 902 when rotating screw 910. Flashing device 900 is also provided with a seal 909 as discussed below. Raised portion 903 may comprise a substantially flat platform portion 920 for providing mating engagement with a bottom surface of seal 909 at flange 930. Arrow 956 indicates how fluid flowing down-roof is guided around hole 906 by raised portion 903.

Figure 18:
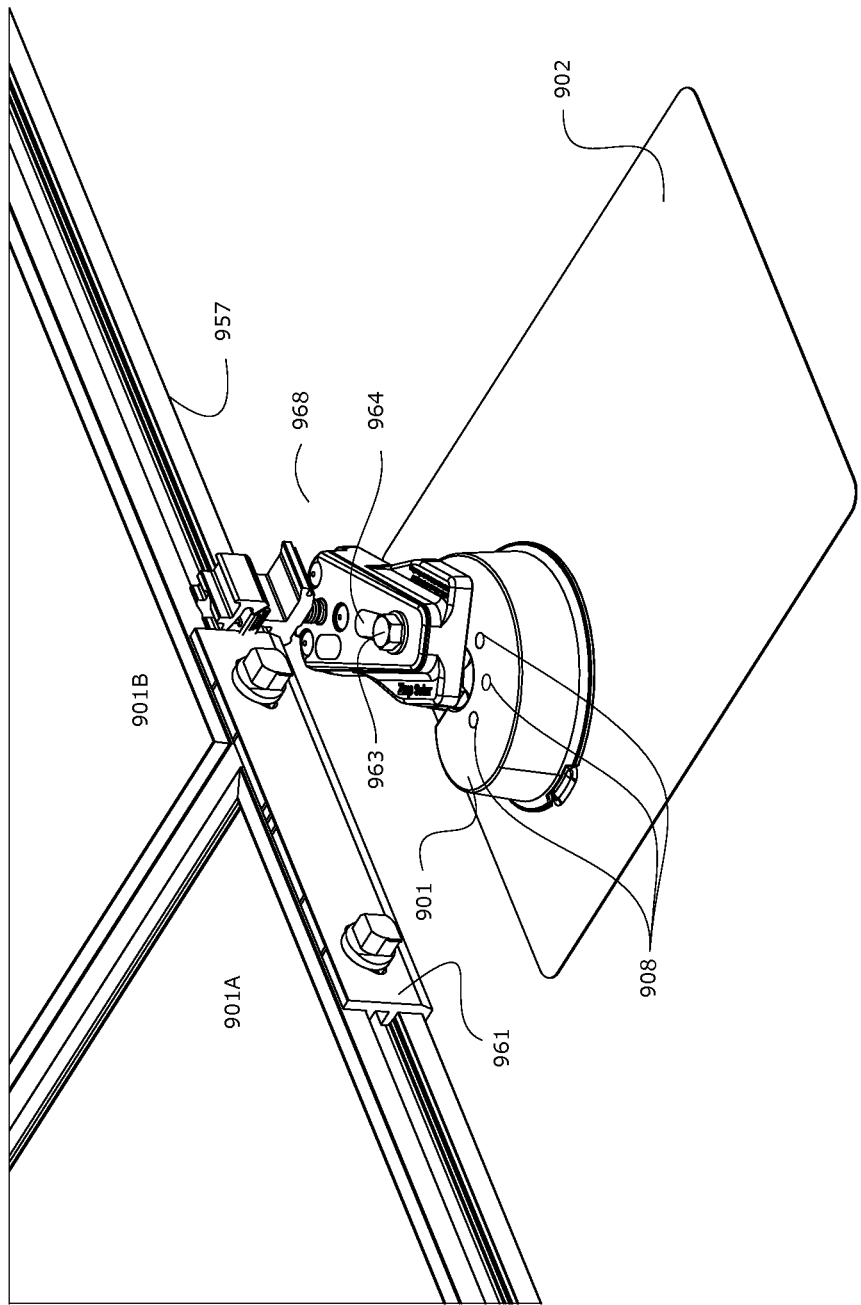
FIG. 18 is an isometric view of a pair of PV modules interconnected to each other by an interlock, with a leveling foot connected to the frame of one of the PV modules and to a flashing device.

FIG. 18 is an isometric view of a pair of PV modules 901A and 901B interconnected to each other by an interlock 961, with a bracket or leveling foot 968 connected to the frame 957 of PV module 901B. Leveling foot 968 is mounted to block 901 via fastener 963. One skilled in the art will recognize that this method of connecting block 901 to bracket 968 still provides a similar amount of lateral flexibility as block 206 in FIG. 4 and block 501 in FIG. 5 since the t-slot, such as t-slot 512 as shown in block 501 in FIG. 5, has been replaced by discretely placed holes 908 and a slot 964 in leveling foot 968. As can be seen in FIG. 18 (and similar to FIG. 4), interlock 961 is in a position that directly blocks, inhibits or conflicts with a potentially desirable position of leveling foot 968 (connecting to frame 957 directly above block 901), yet leveling foot 969 may still be connected to frame 957 as shown due to the enhanced lateral flexibility and improved distal support provided by block 901. One skilled in the art will also recognize that holes 908 are distributed laterally relative to the x-axis and up/down roof relative to the y-axis. Y-axis displacement of holes 908 simplifies installation since it allows flashing devices 900 to be roughly lined up on roof without time spent getting them perfectly straight.

Figure 19:
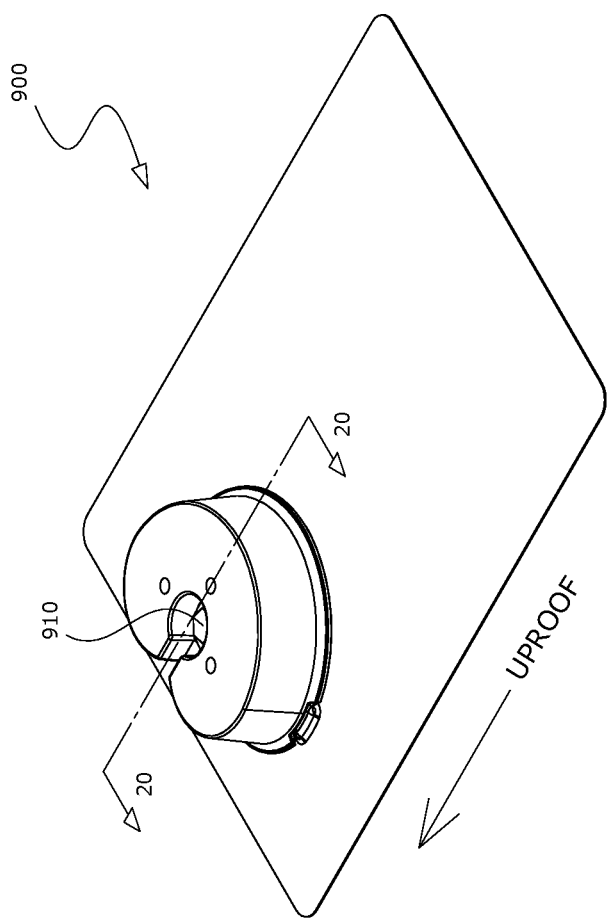
FIG. 19 is an isometric view of the flashing device of FIG. 18.

FIG. 19 is an isometric view of flashing device 900 looking down-roof. Flashing device 900 is shown here with lag screw 900 fully tightened down and connected to a structural support (not shown).

Figure 20:
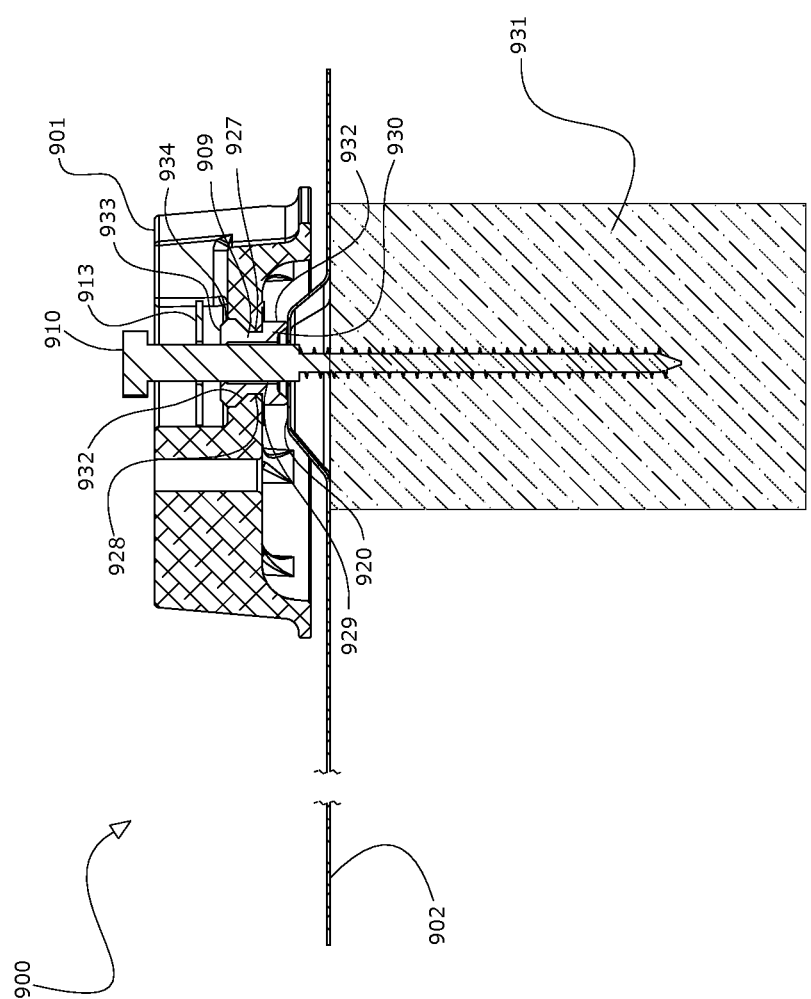
FIG. 20 is a section cut of the flashing device of FIG. 18 with lag screw partially installed.

FIG. 20 shows as section cut of flashing device 900 as indicated in FIG. 19. In this view screw 910 is partially installed but not yet applying force downward on block 901. Block 901 is lightly resting on top of flashing plate 902 with seal 909 just beginning to touch platform 920 and therefore under very little vertical compression. Seal 909 has, however, already been pre-installed into aperture 927 in block 901 by squeezing resilient seal 909 and pressing it into aperture 927. Aperture 927 may comprise an annular flange 928 that mates with a similarly shaped depression in seal 909, except seal 909 is slightly larger and thus the spring force of seal 909 is pushing outward in FIG. 20 and thus enabling block 901 to retain seal 909 without requiring the tightening of screw 910 into structural member 931. Other embodiments contemplate different shapes for seal 909 and aperture 927, but in the instant embodiment block 901 is designed to retain seal 909 and to allow pre-installation of seal 909 before flashing device 900 is installed on a roof.

FIG. 20 further reveals sloping portion at the top of flange 928 and a gap 929 between seal 909 and screw 910 as will be discussed below. Note how gap 929 runs most of the height of seal 900 except a small portion at the top where seal 909 is contacting screw 910 in the nominal state. This small contacting portion ensures that the seal is always touching at the top when under load. Seal 909 is also shown comprising an outward angled finger 932. The outward angle of finger 932 helps to ensure that seal expands outward when being compressed. Seal 909 also comprises an upper portion 933 that rest slightly above the bottom of counterbore 934 in block 901.

Figure 21:
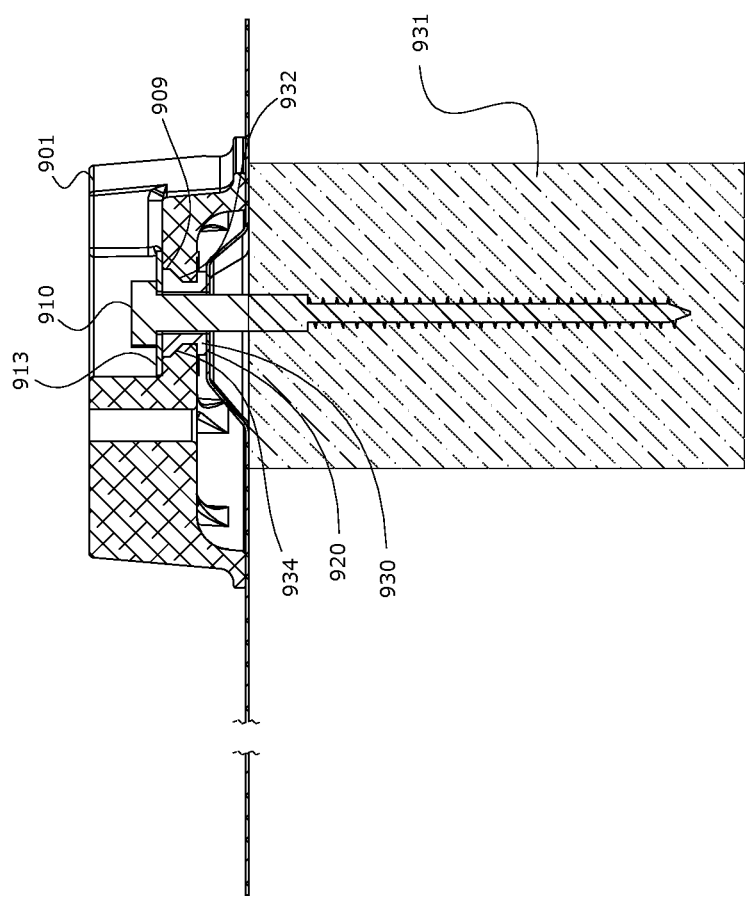
FIG. 21 is a section cut of the flashing device of FIG. 18 with lag screw fully installed.
Figure 22:
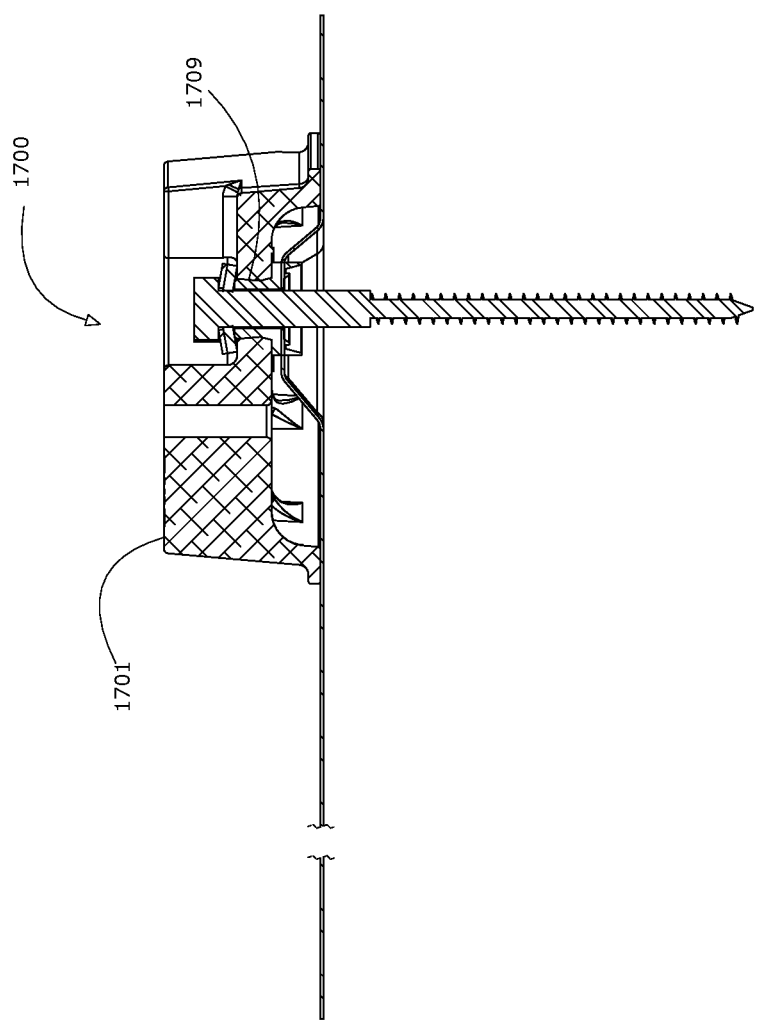
FIG. 22 is a section cut of an alternative embodiment of the flashing device in FIG. 18.
Figure 23:
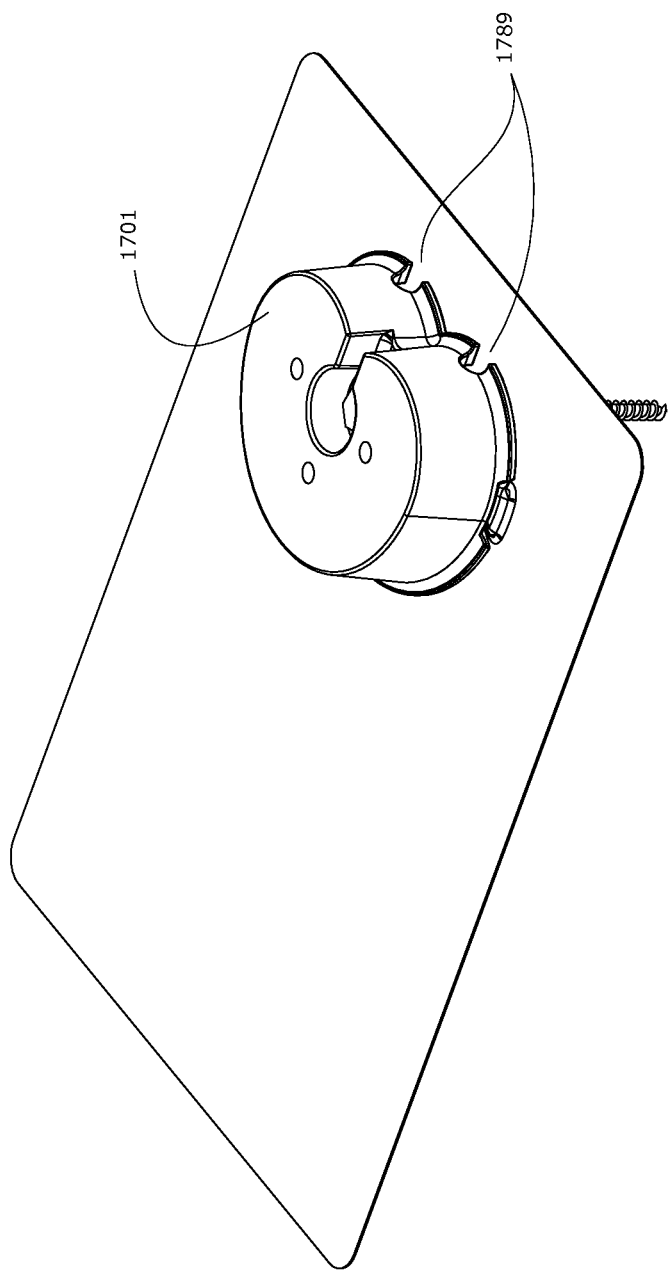
FIG. 23 is an isometric view of the flashing device of FIG. 22 from the top.

FIG. 21 shows the same section cut as FIG. 20 except that screw 910 has now been fully tightened into structural member 931. Washer 913 is now shown having pushed seal 909 downward until washer 913 is stopped by bottom of counterbore 934. The downward force exerted by washer on seal 909 forces seal 909 to flow downward in inward toward screw 910 as it is forced down slope 932. Gap 929 has now been taken up by seal 909 as seal 909 is forced to squeeze screw 910 along the whole length of seal 909, substantially enhancing the water-resisting properties of seal 909. Bottom flange 930 of seal 909 has been significantly compressed and material has flowed outward further filling the gap between the bottom surface of block 901 and the platform 920 of flashing plate 902.

FIG. 21 further reveals an advantage of counterbore 934. Counter bore 934 allows brackets, leveling feet, PV modules, and other devices to be placed substantially anywhere on top of block 901 without hitting screw 910 or touching seal 909. Such an arrangement provides great flexibility to position the bracket in the optimum place to handle loads and/or connect to other devices.

Figure 24:
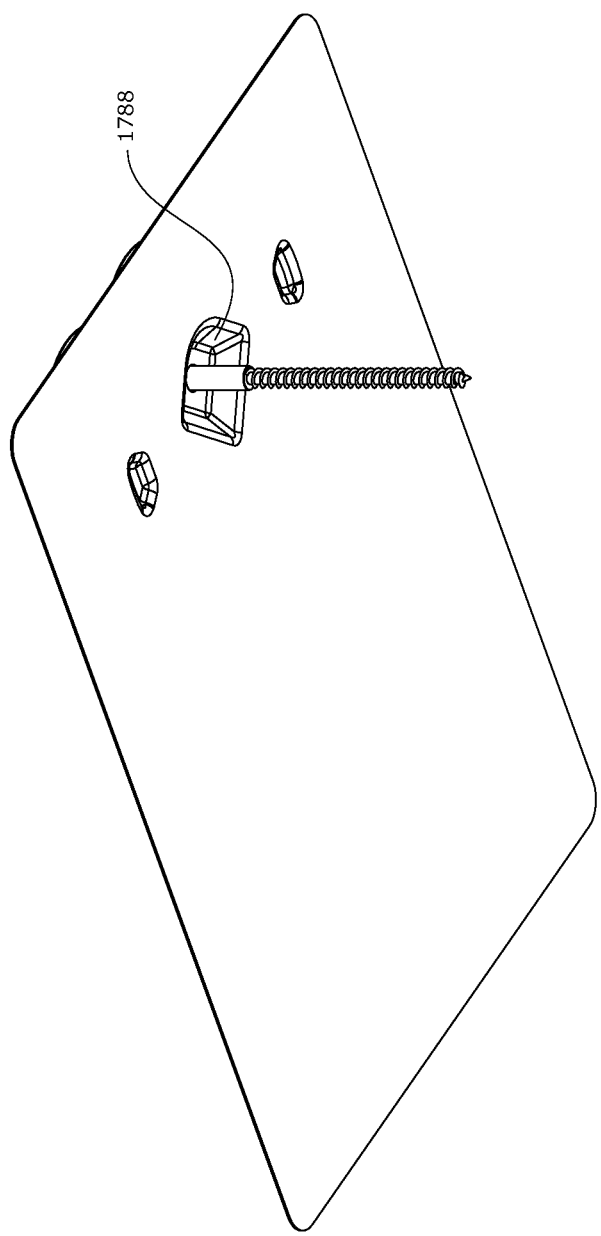
FIG. 24 is an isometric view of the flashing device of FIG. 22 from the bottom.
Figure 25:
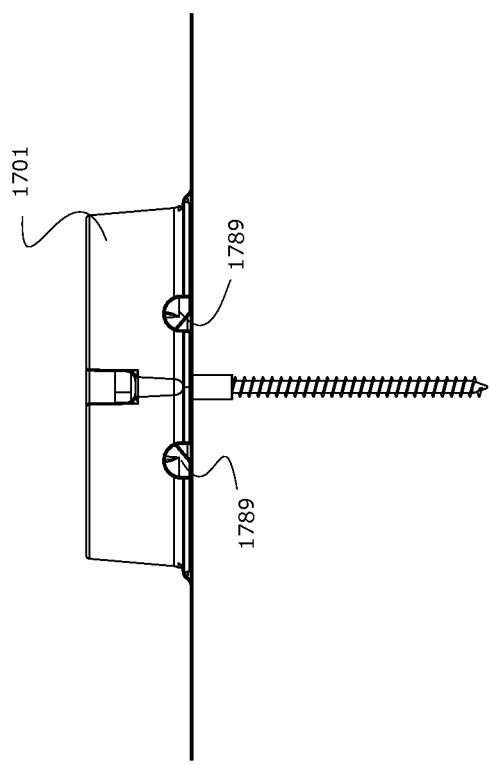
FIG. 25 is a front view of the flashing device of FIG. 22 looking up-roof.

FIGS. 22-25 show another embodiment of a flashing device, flashing device 1700, which is similar to flashing device 900 except that seal 909 has been replaced with seal 1709. Seal 1709 is similar to seal 909 except that side walls of seal 1709 comprise an inward, then outward taper for easier insertion of seal. Block 1701 further provides drain holes 1789 to allow water that enters beneath the upper edge of block 1701 to escape. FIG. 24 shows the underside of flashing device 1700 revealing pocket 1788 underneath a raised portion. Pocket 1788 may be filled with sealant or caulk (not shown) to further enhance waterproofing of flashing 1700. FIG. 25 provides an end view looking up-roof.

Figure 26:
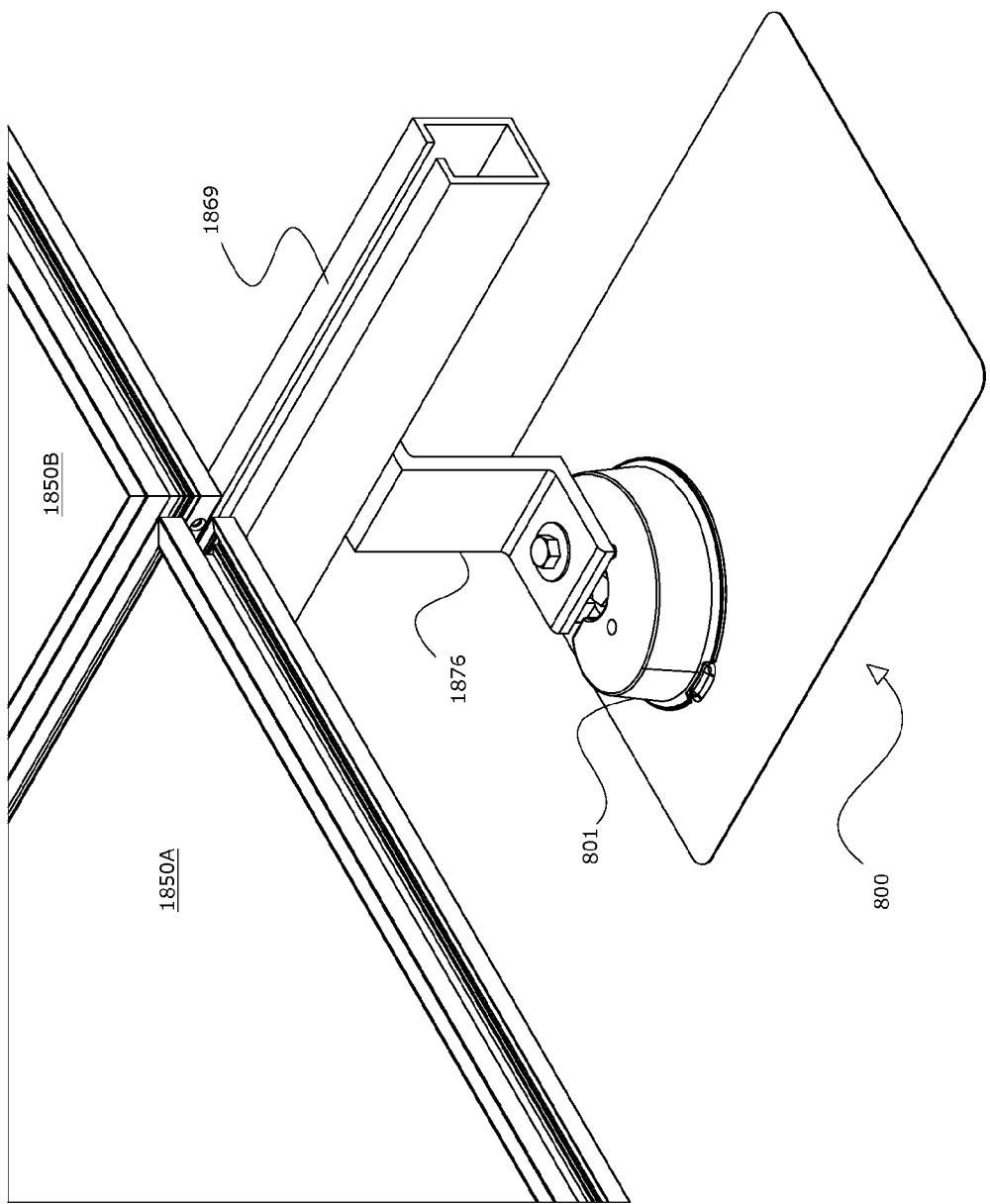
FIG. 26 is an isometric view of the flashing device of FIG. 8 with an alternative embodiment of a bracket and showing a rail and PV modules.

FIG. 26 shows an isometric view of flashing device 800 with an alternate bracket, bracket 1876. Bracket 1876 is connected to a hole 808 in block 801 in the usual way, then the upper portion of bracket 1876 is connected to a strut or rail 1869 as are commonly used in solar mounting systems. PV modules 1850A and 1850B are connected to rail 1869 in one of the common ways known in the art (not shown).

Figure 27:
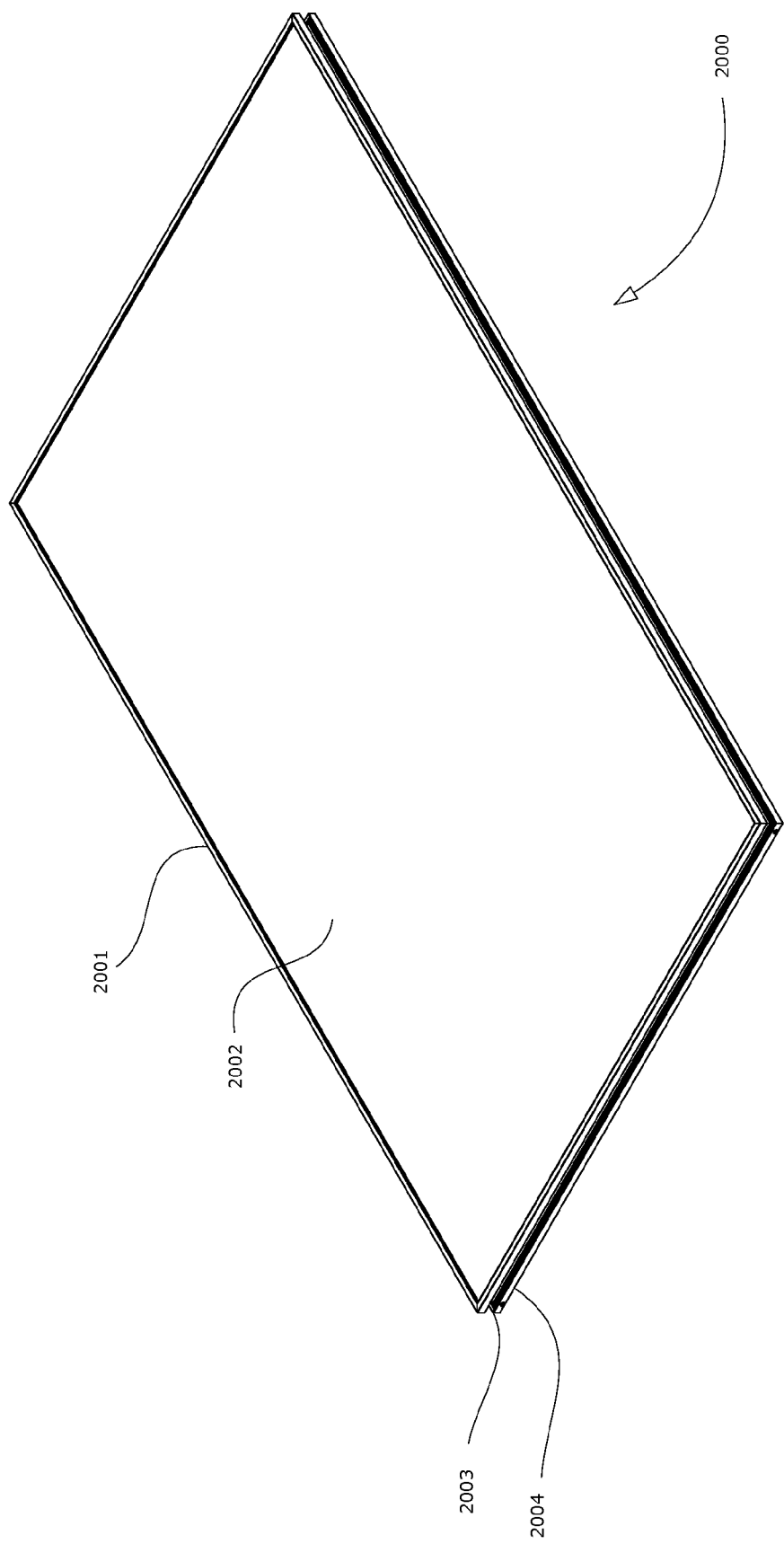
FIG. 27 is an isometric view of a PV module.

FIG. 27 shows a photovoltaic module 2000 assembled with a laminate 2002 surrounded by aluminum frames 2001 that may contain a female groove feature 2003 located on the outside surface 2004 of the frame. As described in previous patents and pending applications of common assignment and at least one common inventor (including, without limitation: U.S. Pat. Nos. 7,592,537 and 8,109,048; U.S. patent application Ser. Nos. 12/594,935, 13/351,397, 13/370,612, 13/405,118, 13/405,118, 13/407,607, 13/410,149, 13/413,329, 13/415,669, 13/415,669, 13/421,797, 13/434,420, 13/434,426, 13/489,680, and 13/491,436 which are incorporated by reference in their entirety as if fully set forth herein.), the groove geometry present in such frames allows for direct (or indirect) attachment of PV, solar-thermal, or other modules to a rooftop or other structure by use of height adjustable mounting feet that may install to or partially within the groove feature 2003, therefore eliminating the need for structurally redundant aluminum (or other structural material) extrusions, castings, assemblies, or rails that are commonly used for residential PV installations in order to create a substantially planar mounting surface above rooftops.

The required quantity and spacing of mounting feet is traditionally a function of the code estimated wind and snow loading pressures that a PV or other module will be subjected to based, in part, on available installation site location data (usually including one or more of: wind speed, category, ground snow load, etc.). Upload or upward forces (direction illustrated in FIG. 32) on a module are usually at least partially the result of wind loading pressures, whereas download or downward forces (direction illustrated in FIG. 31) on a module are usually at least partially the result of combined wind and snow loading. The downward force(s) on a module due to the contribution of wind/snow pressures is often greater than the upload force(s) due to wind loading pressures in regions where snow loads are common. In addition, shear force failure of the fasteners used to secure the mounting feet to a roof top or structure due, for example, to combinations of wind/snow loading may also govern the required quantity and spacing of mounting feet.

In general, it is considered desirable to minimize the number of penetrations into a roof or other structure that are required to positively attach a mounting foot to a surface through the use of common fasteners (for example, to minimize locations where fluid leakage may compromise the integrity of the roof or other support surface). Applicants hereby disclose novel ways of minimizing the number of required penetrations to enable rapid, safe, economical and reliable installations of PV and other modules and arrays.

Figure 28:
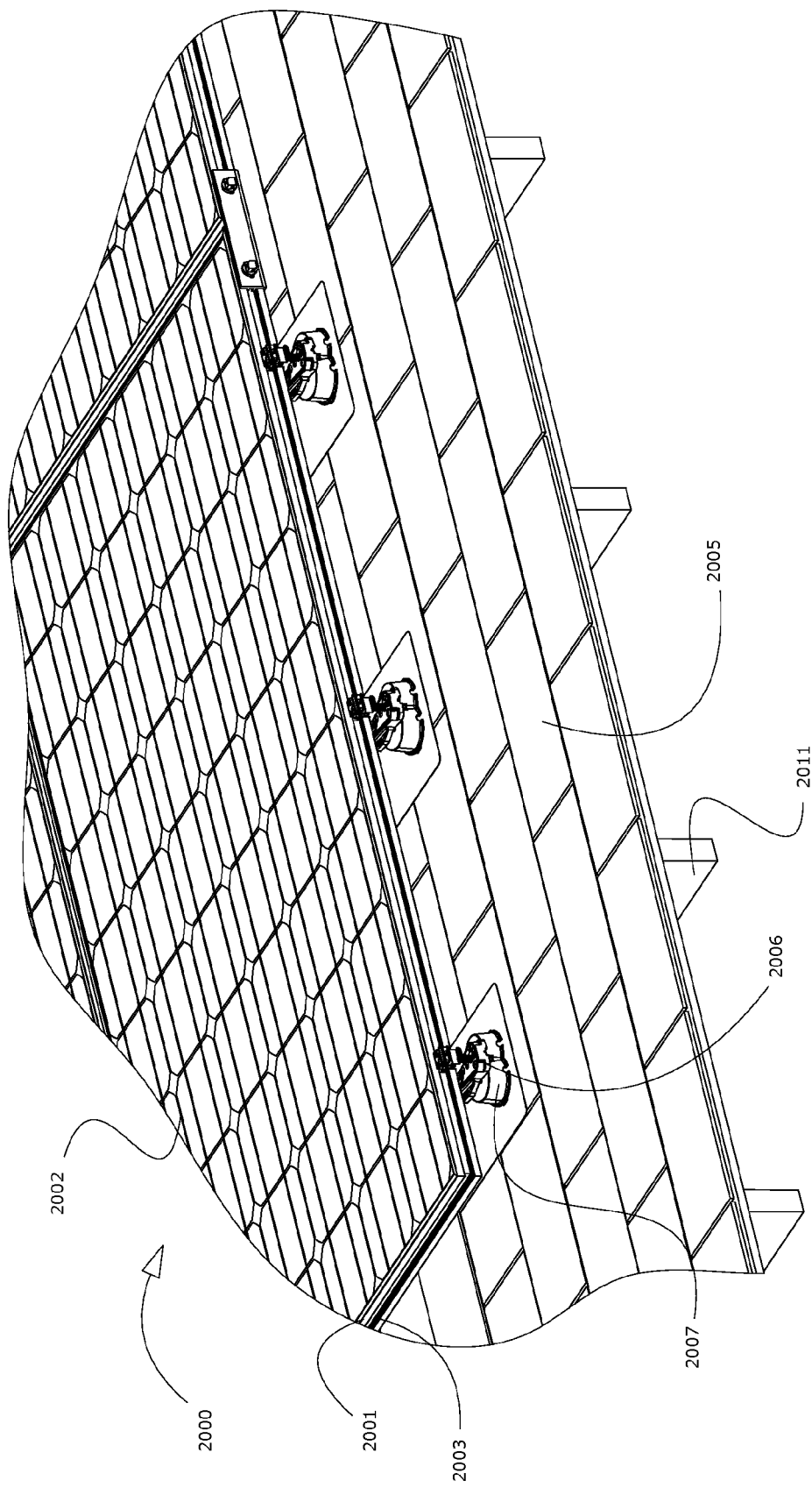
FIG. 28 is an isometric view of a PV module mounted to a support structure, such as a roof.

FIG. 28 shows an array of photovoltaic modules 2000 mounted to a rooftop surface 2005 with height adjustable mounting feet 2006 installed at least partially into the female frame groove feature 2003 at discrete spaced interval distances. The interval distance between the mounting feet 2006 is spaced such that unintentional removal of modules due to wind loading uplift forces is minimized or prevented, as well as excessive deflection in the photovoltaic modules 2000 and shear loading in attachment fasteners is also minimized, prevented or compensated for. In the array shown in FIG. 28 the down force loading is the governing factor determining the required quantity and spacing of mounting feet. The mounting feet 2006 are positively attached to a rooftop flashing block 2007, as through the use of common threaded fasteners, or other means, structures or systems known in the art. The rooftop flashing block 2007 is in turn positively attached to the support surface, such as the surface of roof 2005 and underlying rafters 2011 through the use of common threaded lag fasteners, bolts, screws or the like (not shown). Thus, the installation of each (or at least most of the plurality of) mounting foot 2006 shown in FIG. 28 results in a penetration to the top surface of rooftop 2005, which must be sealed in a manner to prevent water or other fluid ingress into the roof decking, such as by the use of a flashing device 2007 as discussed above.

Figure 29:
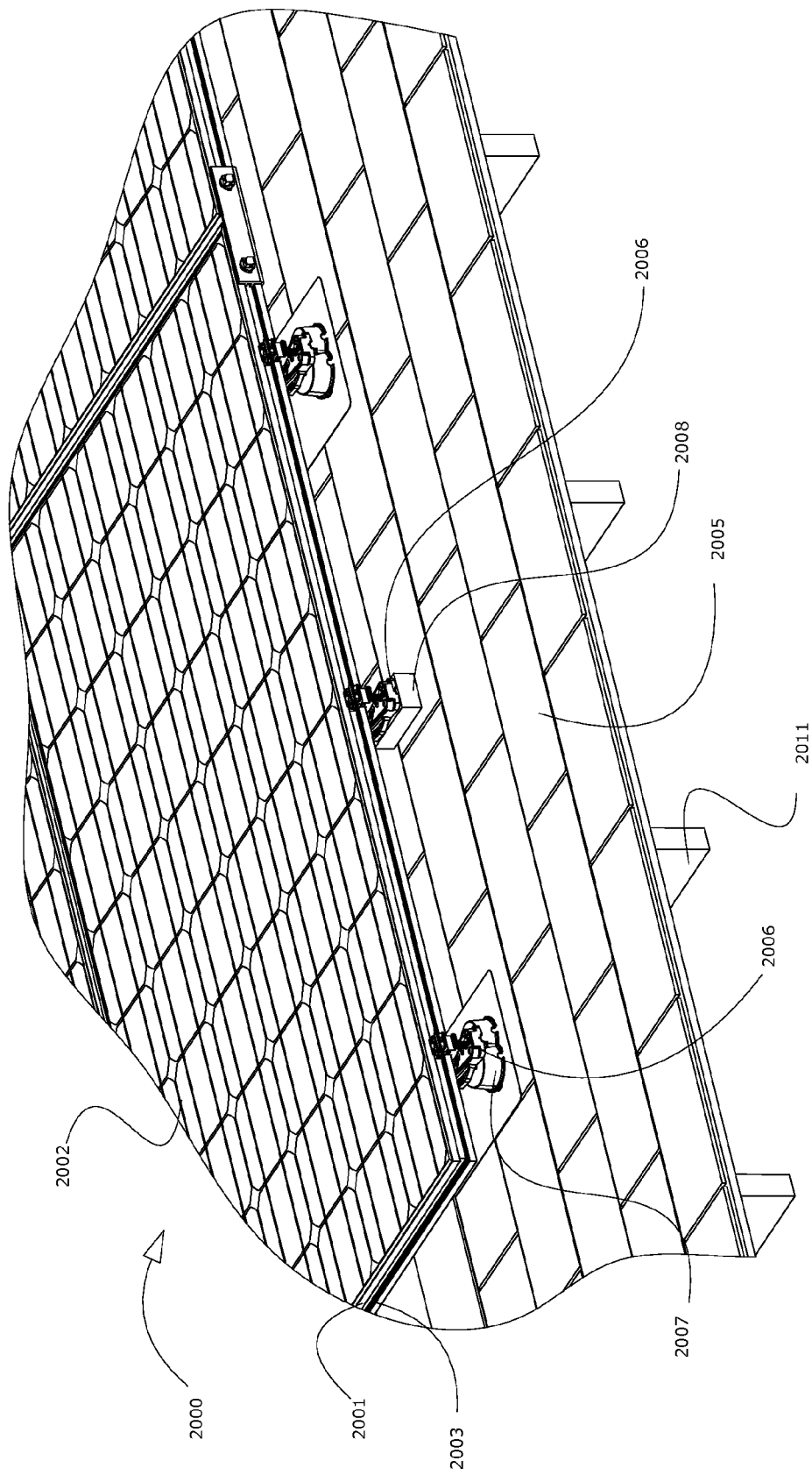
FIG. 29 is another isometric view of a PV module mounted to a support structure, such as a roof.

FIG. 29 shows a similar photovoltaic array as depicted in FIG. 28, except this array is mounted to roof 2005 using a combination of mounting feet 2006 with some positively attached to a flashing block 2007, and others attached to a complaint spring base 2008, essentially forming a "dummy" foot, or non-penetrating substitute for a standard, positively attached flashing device. The quantity and spacing of mounting feet 2006 is once again governed by a combination wind/snow down force loading. All mounting feet 2006 attached to a flashing block 2007 require a penetration into the roof 2005. Mounting feet 2006 attached to a compliant spring base 2008 may not require a penetration, as the spring base 2008 rests on top of the roof 2005 and may not be required to be positively attached to the rooftop 2005, as with a lag screw or other common fastener, since a mounting foot 2006 at this location may only be required to handle downward loads and not upward loads. It is, for example, possible for a PV installation at a specific location to have more need to resist or spread downward forces than to resist of spread upward forces.

Figure 30:
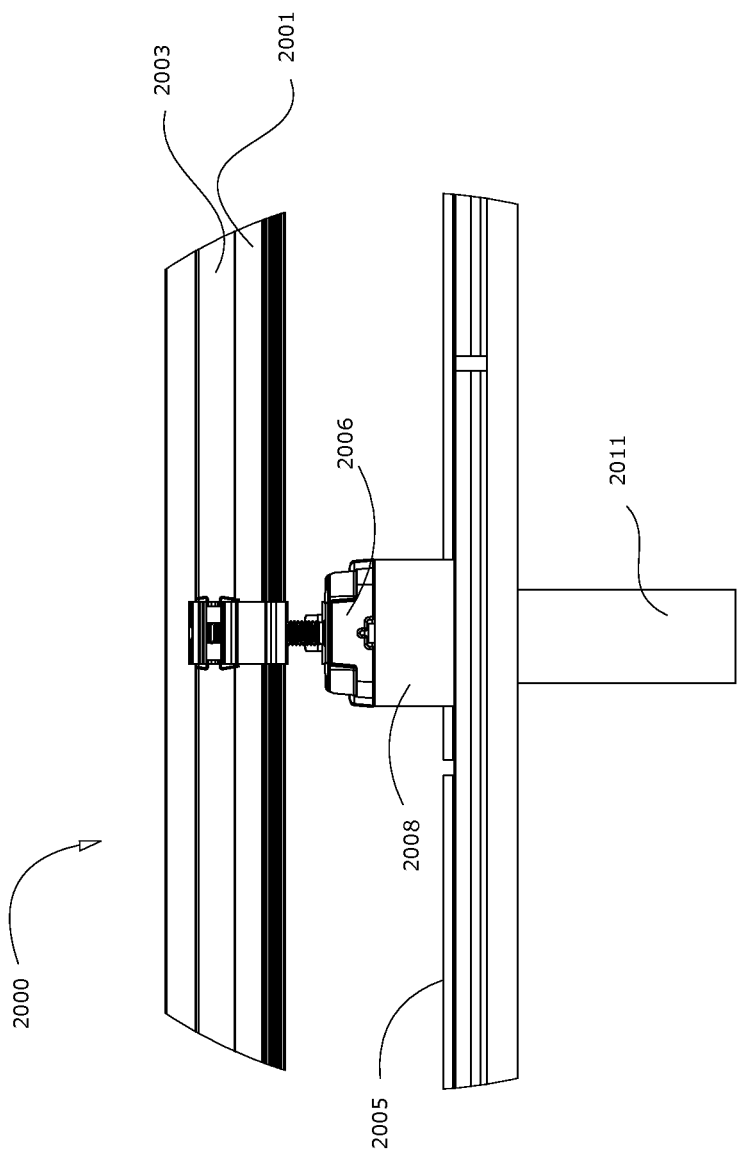
FIG. 30 is a front profile view of a mounting foot connected to a module.

FIG. 30 shows a height adjustable mounting foot 2006 installed into a frame groove feature 2003 and mounted to a compliant spring base 2008. The module frame 2001 shown in FIG. 30 is shown as not undergoing any deflection due to uplift or down loading on the module 2000 and the compliant spring base 2008 may therefore be in a slightly compressed static state, as illustrated.

Figure 31:
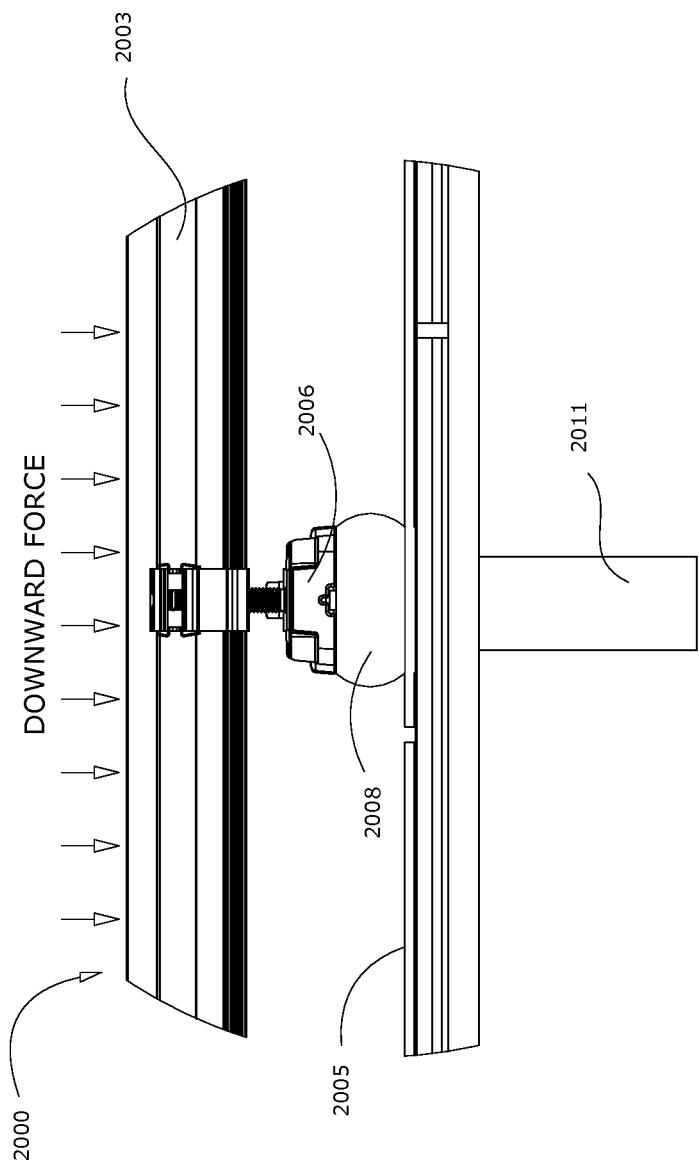
FIG. 31 is a front profile view of another mounting foot connected to a module.

FIG. 31 shows the compliant spring base 2008 in a further compressed state due to combination wind/snow loading down force pressure on module 2000 which results in downward deflection of the frame 2001. By allowing the compliant spring base 2008 to compress and transfer the module loading to the rooftop surface, the point loading of one or more positively attached mounting feet 2006 affixed to the flashing blocks 2007 is reduced, resulting in a more even, distributed loading to the roof structure with less overall penetrations required.

Figure 32:
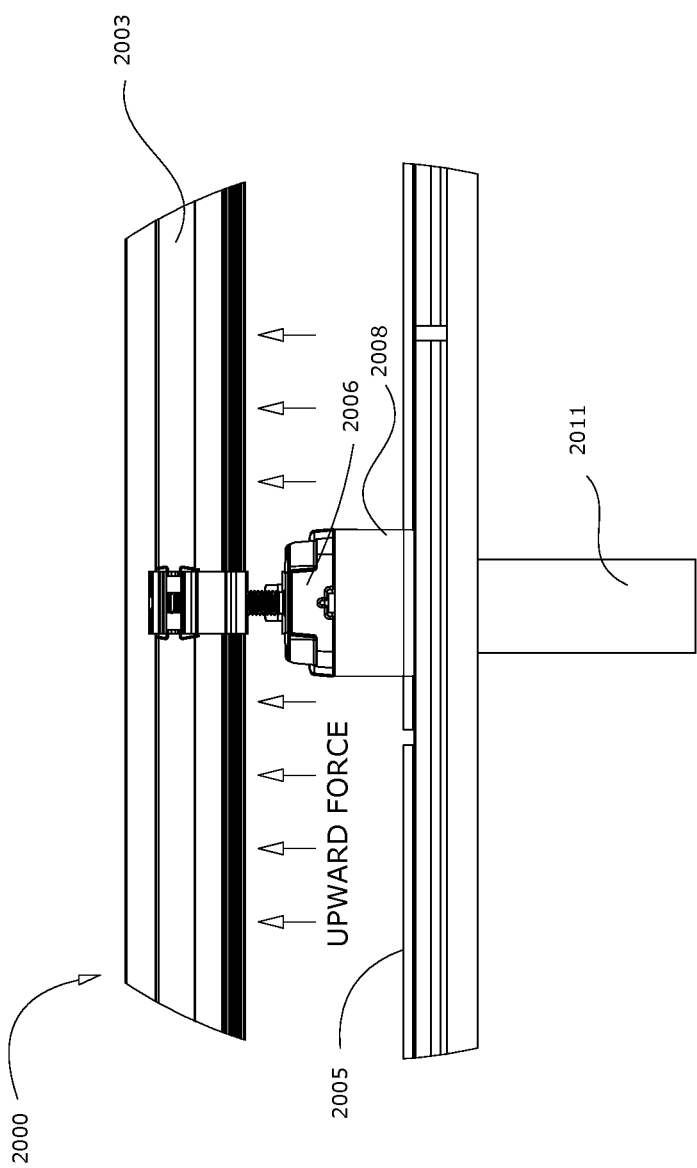
FIG. 32 is a front profile view of yet another mounting foot connected to a module.

FIG. 32 shows compliant spring base 2008 in an extended state, such as due to wind uplift loading pressure on the module 2010 which results in upward deflection of the module frame 2001. Compliant spring base 2008 may be designed so that it does not reach a fully un-sprung state under maximum uplift, such that the bottom of the spring base 2008 should not lift off the roof surface 2005, thus acting to dampen cyclic vibrations transmitted to the roof, as during windy events. Adhesives, mechanical fasteners and other means of positive attachment may also be employed to prevent or inhibit the spring material from lifting off the roof surface, such as may be due to wind uplift forces.

Embodiments of the compliant spring base 2008, as shown in FIGS. 29-32, may be comprised of a relatively soft resistant foam or rubber type material, which may also be resistant to environmental damage, such as ultraviolet (UV) and/or water resistance. Drainage features such as grooves or channels may be added to any surface or interior, such as addition to a bottom surface of the spring base 2008, in order to allow for accumulated moisture (such as due to rain, etc.) to drain from the roof/base interface. Alternate embodiments of the spring base 2008 may be manufactured from spring steel, aluminum, plastics, metal, or any other suitable springy or resilient material(s).

Figure 33:
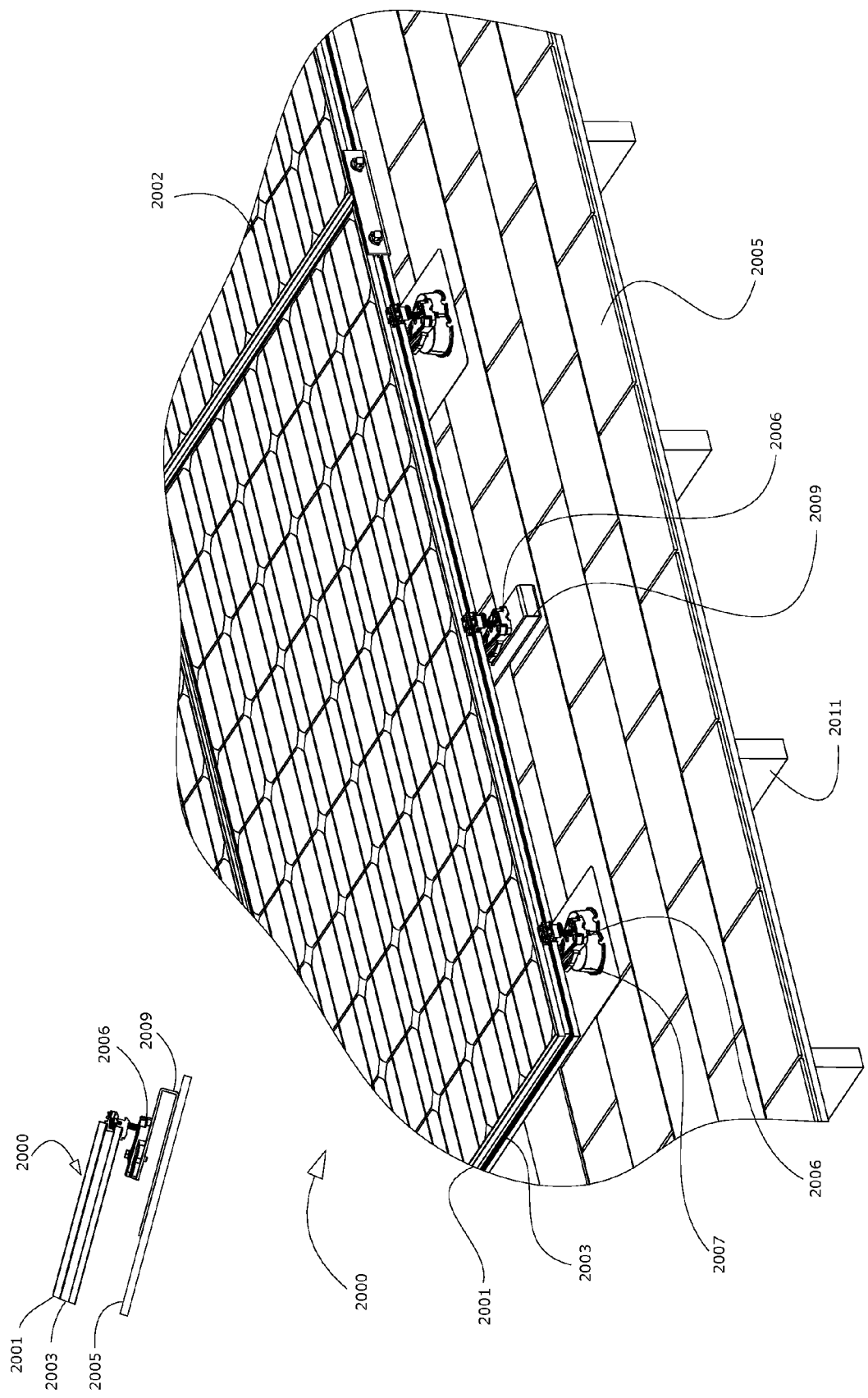
FIG. 33 is yet another isometric view of a PV module mounted to a support structure, such as a roof.

FIG. 33 shows yet another alternate embodiment of a spring base 2009 that is constructed of metal, plastic or other suitable resilient or spring material. While the embodiments shown include variations of utilizing a compliant spring base beneath a mounting foot, such a springy type unit, structure, system, or means may be used otherwise in association with a mounting foot, as would be apparent to one of skill in the art, and are hereby specifically contemplated and disclosed.

Some advantages of utilizing a compliant spring base beneath or otherwise in association with a mounting foot may include, but are not limited to, that it may enable reduction in total number of rooftop penetrations required for a photovoltaic module installation, and thus a reduction in flashing devices, while still preventing excessive deflection in a module due to down force combination loading from wind/snow; may enable reduction in total installation time due to a reduced number of rooftop penetrations requiring sealing to prevent moisture ingress; may enable reduction in total installation material costs due to less flashing devices being required per module installed; may enable mounting feet to be placed in locations on roof where rafters are not located; and may enable dampening of wind induced array vibrations being transferred to the underlying structure.

Advantages of the flashing devices disclosed herein may include: improved pressure on the seal around the lag screw; increased mounting location flexibility due to separately positionable bracket that enables adjustability relative to the lag screw after installation thereof; may work better with many rail-free mounting systems since the elimination of rails may result in less flexibility in locating certain mounting components and the instant flashing devices comprise multiple holes or slots for connecting to different locations along a PV module frame; reduced cost due to optimization of materials usage; and improved ability to account for misalignment of components during installation.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions, and sub-combinations as are within their true spirit and scope.

What is claimed as invention is:

1. An attachment system for solar equipment, comprising:
   (a) a flashing plate having a raised portion with a single central fastener aperture passing therethrough;
   (b) a support body having a single central fastener aperture passing therethrough, the support body portion having a flat mounting surface with a plurality of mounting holes formed therein, wherein for each mounting hole a distance from the center of the mounting hole to the nearest outer edge of the flat mounting surface is at least as large as a radial distance from the center of the mounting hole to the center of the single central fastener aperture in the support body such that the center of said each mounting hole is not closer to the nearest outer edge of the flat mounting surface than to the center of the single central fastener aperture;
   (c) a fluid restrictor having a single central fastener aperture passing therethrough, the fluid restrictor being positioned between the flashing plate and the support body; and
   (d) a fastener passing through the single central fastener apertures in the flashing plate, support body and fluid restrictor.

2. The attachment system of claim 1, wherein a side edge of the mounting surface is curved around the plurality of mounting holes.

3. The attachment system of claim 2, wherein a side edge of the mounting surface of the support body wraps around edges of a plurality of circles, wherein each circle is centered on one of the mounting holes and has a radius greater than the distance from the mounting hole to the single central fastener aperture in the support body.

4. The attachment system of claim 3, wherein the plurality of circles overlap one another.

5. The attachment system of claim 1, wherein the single central fastener aperture passing through the support body is recessed from the flat mounting surface of the support body.

6. The attachment system of claim 1, wherein the plurality of mounting holes are all equidistantly spaced away from the single central fastener aperture in the support body.

7. The attachment system of claim 1, further comprising:
   (e) a height-adjustable leveling foot mounted on top of the mounting surface with the fastener passing through the height-adjustable leveling foot, wherein the leveling foot is fully rotatable around the fastener such that the leveling foot is not primarily cantilevered off of the mounting surface.

8. The attachment system of claim 1, wherein the support body further comprises a rear slot extending from the single central fastener aperture to a rear edge of the support body.

9. An attachment system for solar equipment, comprising:
   (a) a flashing plate having a raised portion with a fastener aperture passing therethrough;
   (b) at least one anti-rotation bump on the flashing plate;
   (c) a support body having a fastener aperture passing therethrough, the support body portion having a flat mounting surface with at least one mounting hole formed therein;
   (d) at least one anti-rotation notch on the support body;
   (e) a fluid restrictor having a fastener aperture passing therethrough, the fluid restrictor being positioned between the flashing plate and the support body; and
   (f) a fastener passing through the fastener apertures in the flashing plate, support body and fluid restrictor,
   wherein the anti-rotation notch on the support body mates with the anti-rotation bump on the flashing plate to resist rotation of the support body with respect to the flashing plate when the fastener is rotated.

10. The system of claim 9, wherein the anti-rotation notch on the support body permits water drainage therethrough.

11. The system of claim 9, wherein the at least one mounting hole in the support body comprises a plurality of mounting holes formed in the support body.

12. The system of claim 11, wherein a side edge of the mounting surface is curved around the plurality of mounting holes.

13. The system of claim 11, wherein the number of mounting holes in the support body is greater than the number of fasteners passing through the flashing plate, support body and fluid restrictor.

14. The system of claim 9, wherein the fastener aperture passing through the support body is recessed from the flat mounting surface of the support body.

* * * * *